(12) United States Patent
Jeong et al.

(10) Patent No.: US 7,745,828 B2
(45) Date of Patent: Jun. 29, 2010

(54) ORGANIC LIGHT EMITTING DEVICE AND MANUFACTURING METHOD THEREOF

(75) Inventors: Byoung-Seong Jeong, Yongin-si (KR);
Kyu-Sik Cho, Suwon-si (KR);
Joon-Hoo Choi, Seoul (KR);
Yong-Hwan Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 11/982,169

(22) Filed: Oct. 31, 2007

(65) Prior Publication Data
US 2008/0169463 A1    Jul. 17, 2008

(30) Foreign Application Priority Data
Jan. 11, 2007    (KR) ............... 10-2007-0003537

(51) Int. Cl.
*H01L 27/14* (2006.01)
(52) U.S. Cl. ............... 257/72; 257/59; 257/E51.018; 257/88
(58) Field of Classification Search .......... 257/E51.018, 257/759, 59, 72, 88, E51.022, E51.019
See application file for complete search history.

(56) References Cited

U.S. PATENT DOCUMENTS

| | | | |
|---|---|---|---|
| 6,566,687 B2 | 5/2003 | Andry et al. | |
| 6,853,004 B2 | 2/2005 | Ohtani | |
| 7,084,081 B2 | 8/2006 | Goto | |
| 2002/0146871 A1* | 10/2002 | Watanabe et al. | 438/151 |
| 2003/0141504 A1* | 7/2003 | Kuwabara et al. | 257/66 |
| 2005/0019996 A1* | 1/2005 | Tsao | 438/166 |
| 2007/0012919 A1* | 1/2007 | Oh et al. | 257/59 |

FOREIGN PATENT DOCUMENTS

| | | |
|---|---|---|
| CN | 1841779 | 10/2006 |
| JP | 5-129202 | 5/1993 |
| JP | 5-129567 | 5/1993 |
| JP | 5-160023 | 6/1993 |
| JP | 6-29319 | 2/1994 |
| JP | 6-45354 | 2/1994 |
| JP | 9-116164 | 5/1997 |

(Continued)

OTHER PUBLICATIONS

Patent Abstracts of Japan, Publication No. 05-129202, May 25, 1993, 2 pp.

(Continued)

*Primary Examiner*—Thanh V Pham
*Assistant Examiner*—Maria Ligai
(74) *Attorney, Agent, or Firm*—Innovation Counsel LLP

(57) ABSTRACT

An organic light emitting device includes a substrate, first and second ohmic contacts formed on the substrate, a driving semiconductor formed on the substrate and the first and second ohmic contacts and including polysilicon, a driving input electrode electrically connected to the first ohmic contact, a driving output electrode electrically connected to the second ohmic contact, a first gate insulating layer formed on the driving semiconductor, the driving input electrode, and the driving output electrode, and a driving control electrode formed on the first gate insulating layer and overlapping the driving semiconductor.

9 Claims, 57 Drawing Sheets

FOREIGN PATENT DOCUMENTS

| | | |
|---|---|---|
| JP | 11-340469 | 12/1999 |
| JP | 2001-102594 | 4/2001 |
| JP | 2002-33485 | 1/2002 |
| JP | 2002-185005 | 6/2002 |
| JP | 2003-23162 | 1/2003 |
| JP | 2003-508899 | 3/2003 |
| JP | 2003-515928 | 5/2003 |
| JP | 2004-327617 | 11/2004 |
| JP | 2005-183943 | 7/2005 |
| JP | 2005-303265 | 10/2005 |
| JP | 2006-58676 | 3/2006 |
| JP | 2006-519478 | 8/2006 |
| KR | 2002-0036916 | 5/2002 |
| KR | 10-2005-0031398 | 4/2005 |

OTHER PUBLICATIONS

Patent Abstracts of Japan, Publication No. 05-129567, May 25, 1993, 1 p.
Patent Abstracts of Japan, Publication No. 05-160023, Jun. 25, 1993, 1 p.
Patent Abstracts of Japan, Publication No. 06-029319, Feb. 4, 1994, 1 p.
Patent Abstracts of Japan, Publication No. 06-045354, Feb. 18, 1994, 1 p.
Patent Abstracts of Japan, Publication No. 09-116164, May 2, 1997, 1 p.
Patent Abstracts of Japan, Publication No. 11-340469, Dec. 10, 1999, 1 p.
Patent Abstracts of Japan, Publication No. 2001-102594, Apr. 13, 2001, 1 p.
Patent Abstracts of Japan, Publication No. 2002-033485, Jan. 31, 2002, 1 p.
Patent Abstracts of Japan, Publication No. 2002-185005, Jun. 28, 2002, 1 p.
Patent Abstracts of Japan, Publication No. 2003-023162, Jan. 24, 2003, 1 p.
English Language Abstract, Publication No. WO0115234, Mar. 1, 2001, for Japanese Publication No. 2003-508899, Mar. 4, 2003, 2 pp.
English Language Abstract, Publication No. JP2003515928, May 7, 2003, 1 p.
Patent Abstracts of Japan, Publication No. 2004-327617, Nov. 18, 2004, 1 p.
Patent Abstracts of Japan, Publication No. 2005-183943, Jul. 7, 2005, 1 p.
Patent Abstracts of Japan, Publication No. 2005-303265, Oct. 27, 2005, 1 p.
Patent Abstracts of Japan, Publication No. 2006-058676, Mar. 2, 2006, 2 pp.
English Language Abstract, Publication No. JP2006519478, Aug. 24, 2006, 1 p.
Korean Patent Abstracts, Publication No. 1020020036916, May 17, 2002, 1 p.
Korean Patent Abstracts, Publication No. 1020050031398, Apr. 6, 2005, 1 p.

* cited by examiner

ORGANIC LIGHT EMITTING DEVICE AND MANUFACTURING METHOD THEREOF

CROSS-REFERENCE TO RELATED APPLICATION

This application claims priority to and the benefit of Korean Patent Application No. 10-2007-0003537 filed in the Korean Intellectual Property Office on Jan. 11, 2007, the entire contents of which are incorporated herein by reference.

BACKGROUND OF THE INVENTION (a) Field of the Invention

The present invention relates to an organic light emitting device and a manufacturing method thereof.

(b) Description of the Related Art

Recent trends of lightweight and thin personal computers and televisions sets also require lightweight and thin display devices, and flat panel displays satisfying such a requirement are being substituted for conventional cathode ray tubes (CRT).

The flat panel displays include displays such as a liquid crystal display (LCD), a field emission display (FED), an organic light emitting device (OLED), and a plasma display panel (PDP).

Among the flat panel displays, the organic light emitting device is the most promising because of its low power consumption, fast response time, wide viewing angle, and high contrast ratio.

An organic light emitting device is a self-emissive display device that includes two electrodes and an organic light emitting layer interposed therebetween. One of the two electrodes injects holes and the other of the two electrodes injects electrons into the light emitting layer. The injected electrons and holes combine and form exitons and the exitons emit light as discharge energy.

The organic light emitting devices may be divided into two types, a passive matrix organic light emitting devices, and active matrix organic light emitting devices, based on the driving method utilized.

The passive matrix type of organic light emitting device includes a plurality of anode lines, a plurality of cathode lines intersecting the anode lines, and a plurality of pixels, each including a light emission layer, and the selection of one of the anode lines and one of the cathode lines causes light emission of a pixel located at the intersection of the selected signal lines. In contrast, the active matrix type of organic light emitting device includes a plurality of pixels, each including a switching transistor, a driving transistor, and a storage capacitor, as well as an anode, a cathode, and a light emission layer. The driving transistor receives a data voltage from the switching transistor and drives a current having a magnitude determined depending on the data voltage, and the current from the driving transistor enters the light emission layer to cause light emission having intensity depending on the current.

The thin film transistor such as the switching transistor and the driving transistor includes polycrystalline silicon (polysilicon) or amorphous silicon.

Amorphous silicon may be deposited under a low temperature, and thereby may be deposited on a substrate made of a glass having a low fusion point. However, the amorphous silicon has a low mobility of charge such that the thin film transistor having a channel of the amorphous silicon may have a limited performance. In contrast, the polysilicon may have a high mobility of charge such that the thin film transistor having a channel of the polysilicon may have a high performance. However, it is hard to deposit the polysilicon and the thin film transistor including the polysilicon may have a large leakage current. The leakage current may be increased when the surface of the polysilicon is damaged by an etching process, etc.

The above information disclosed in this Background section is only for enhancement of understanding of the background of the invention and therefore it may contain information that does not form the prior art that is already known in this country to a person of ordinary skill in the art.

SUMMARY OF THE INVENTION

An organic light emitting device according to an embodiment of the present invention includes a substrate, first and second ohmic contacts formed on the substrate, a driving semiconductor formed on the substrate and the first and second ohmic contacts and including polysilicon, a driving input electrode electrically connected to the first ohmic contact, a driving output electrode electrically connected to the second ohmic contact, a first gate insulating layer formed on the driving semiconductor, the driving input electrode, and the driving output electrode, and a driving control electrode formed on the first gate insulating layer and overlapping the driving semiconductor.

The organic light emitting device may further include third and a fourth ohmic contacts formed on the substrate, a switching semiconductor formed on the third and fourth ohmic contacts, a switching input electrode electrically connected to the third ohmic contact, a switching output electrode electrically connected to the fourth ohmic contact, and a control electrode formed on the first gate insulating layer and overlapping the switching semiconductor. The switching output electrode may be electrically connected to the driving input electrode.

The organic light emitting device may further include a switching control electrode formed on the first gate insulating layer, a second gate insulating layer formed on the switching control electrode, a switching semiconductor formed on the second gate insulating layer and overlapping the switching control electrode, third and fourth ohmic contacts formed on the switching semiconductor, a switching input electrode formed on the third ohmic contact, and a switching output electrode formed on the fourth ohmic contact. The switching output electrode may be electrically connected to the driving input electrode.

The organic light emitting device may further include a switching control electrode formed on the substrate, a switching semiconductor formed on the first gate insulating layer and overlapping the switching control electrode, third and fourth ohmic contacts formed on the switching semiconductor, a switching input electrode formed on the third ohmic contact, and a switching output electrode formed on the fourth ohmic contact. The switching output electrode may be electrically connected to the driving input electrode.

The switching semiconductor may include amorphous silicon or polysilicon.

The first and second ohmic contacts may include polysilicon.

The first and second ohmic contacts may have substantially the same planar shape as the driving input electrode and the driving output electrode.

The organic light emitting device may further include a passivation layer formed on the driving output electrode and the driving input electrode, a first electrode formed on the passivation layer and connected to the driving output electrode, a light emitting member formed on the first electrode, and a second electrode formed on the light emitting member.

The organic light emitting device may further include a blocking film formed on the substrate.

A manufacturing method for an organic light emitting device according to an embodiment of the present invention includes forming first and second ohmic contacts on the substrate, forming a semiconductor pattern including polysilicon on the substrate, crystallizing the semiconductor pattern to form a driving semiconductor, forming a driving input electrode and a driving output electrode on the ohmic contact and the driving semiconductor, forming a first gate insulating layer on the driving input electrode and the driving output electrode, and forming a control electrode on the first gate insulating layer.

The crystallization may be performed by solid phase crystallization.

The formation of the first and second ohmic contacts and the formation of the driving input electrode and the driving output electrode may be performed by using the same mask.

The substrate manufacturing method may further include forming third and fourth ohmic contacts on the substrate, forming a switching semiconductor on the third and fourth ohmic contacts, forming a switching input electrode electrically connected to the third ohmic contact, forming a switching output electrode electrically connected to the fourth ohmic contact and the driving input electrode, and forming a switching control electrode overlapping the switching semiconductor on the first gate insulating layer.

The substrate manufacturing method may further include forming a switching control electrode on the first gate insulating layer, forming a second gate insulating layer on the switching control electrode, forming a switching semiconductor overlapping the switching control electrode on the second gate insulating layer, forming third and fourth ohmic contacts on the switching semiconductor, forming a switching input electrode on the third ohmic contact, and forming a switching output electrode electrically connected to the driving input electrode on the fourth ohmic contact.

The substrate manufacturing method may further include forming a switching control electrode on the substrate, forming a switching semiconductor overlapping the switching control electrode on the first gate insulating layer, forming third and fourth ohmic contacts on the switching semiconductor, forming a switching input electrode on the third ohmic contact, and forming a switching output electrode electrically connected to the driving input electrode on the fourth ohmic contact.

The switching semiconductor may include amorphous silicon or polysilicon.

DETAILED DESCRIPTION OF THE EMBODIMENTS

Figure 1:
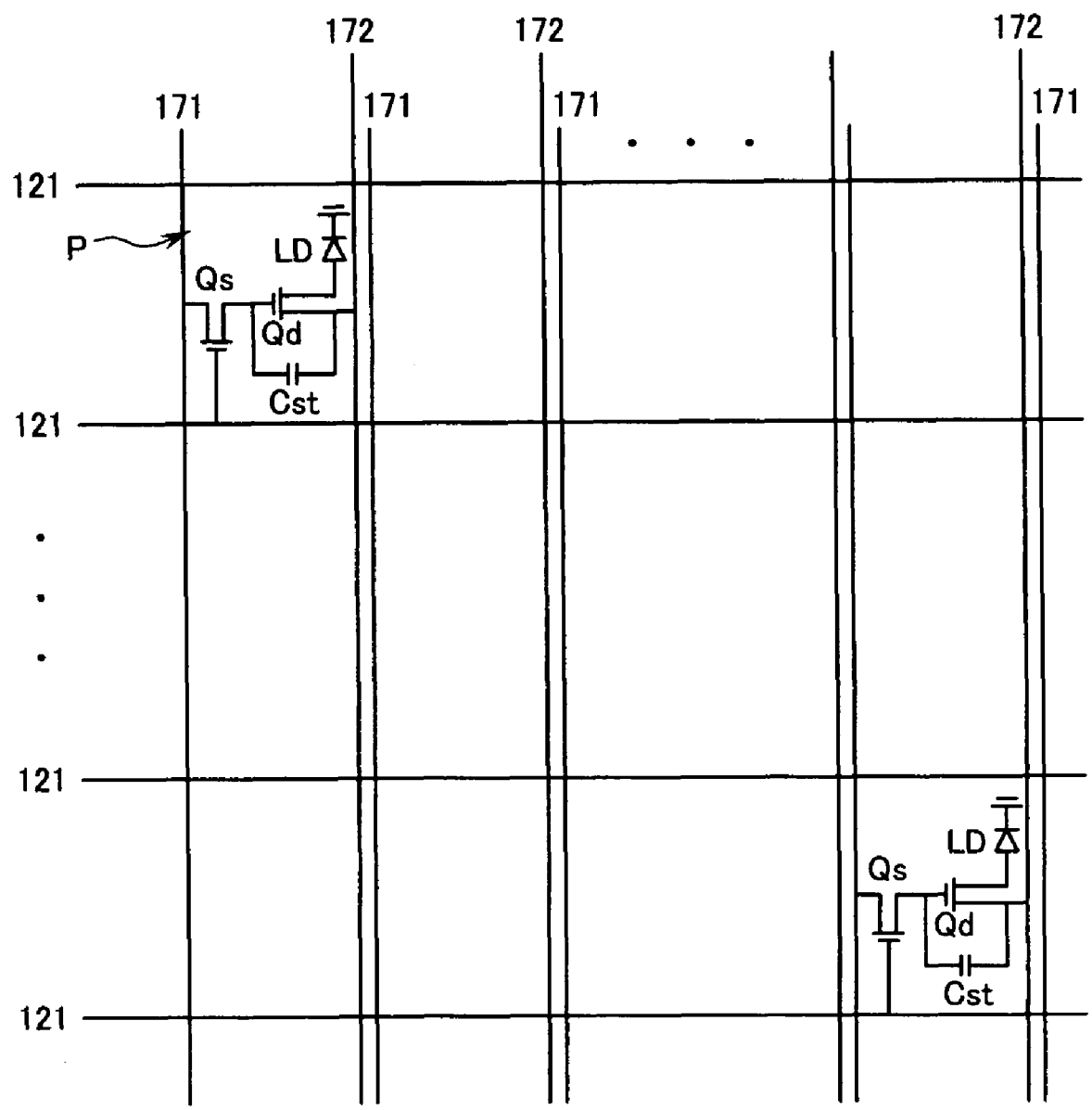
FIG. 1 is an equivalent circuit diagram of an organic light emitting device according to an embodiment of the present invention.

The present invention is below described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, an organic light emitting device according to an embodiment of the present invention will be described in detail with reference to FIG. 1.

FIG. 1 is a layout view of an organic light emitting device according to an embodiment of the present invention.

Referring to FIG. 1, an organic light emitting device according to an embodiment of the present invention includes a plurality of signal lines 121, 171, and 172 and a plurality of pixels PX connected thereto and arranged substantially in a matrix.

The signal lines include a plurality of gate lines 121 transmitting gate signals (or scanning signals), a plurality of data lines 171 transmitting data signals, and a plurality of driving voltage lines 172 transmitting a driving voltage. The gate lines 121 extend substantially in a row direction and substantially parallel to each other, while the data lines 171 and the driving voltage lines 172 extend substantially in a column direction and substantially parallel to each other.

Each pixel PX includes a switching transistor Qs, a driving transistor Qd, a storage capacitor Cst, and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal applied to the gate line 121.

The driving transistor Qd has a control terminal connected to the switching transistor Qs, an input terminal connected to the driving signal line 172, and an output terminal connected to the organic light emitting device LD. The driving transistor Qd drives an output current $I_{LD}$ having a magnitude depending on the voltage between the control terminal and the output terminal thereof.

The capacitor Cst is connected between the control terminal and the output terminal of the driving transistor Qd. The capacitor Cst stores the data signal applied to the control terminal of the driving transistor Qd and maintains the data signal after the switching transistor Qd turns off.

The organic light emitting device LD has an anode connected to the output terminal of the driving transistor Qd and a cathode connected to a common voltage Vss. The organic light emitting device LD emits light having an intensity depending on an output current $I_{LD}$ of the driving transistor Qd, thereby displaying images.

The switching transistor Qs and the driving transistor Qd are n-channel field effect transistors (FETs). However, at least one of the switching transistor Qs and the driving transistor Qd may be a p-channel FET. In addition, the connections among the transistors Qs and Qd, the capacitor Cst, and the organic light emitting device LD may be modified.

Figure 2:
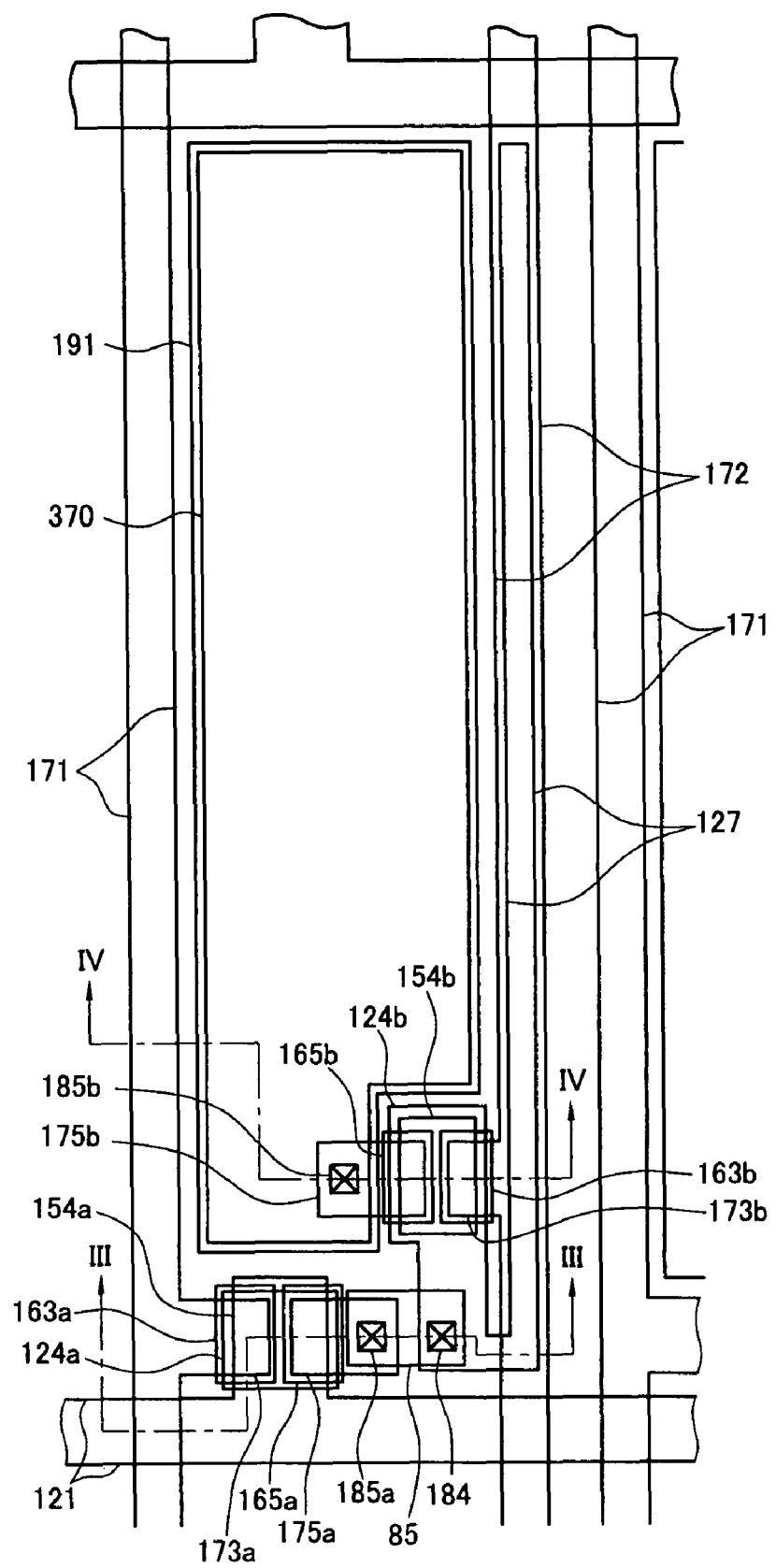
FIG. 2 is a layout view of an organic light emitting device according to a first embodiment of the present invention.
Figure 3:
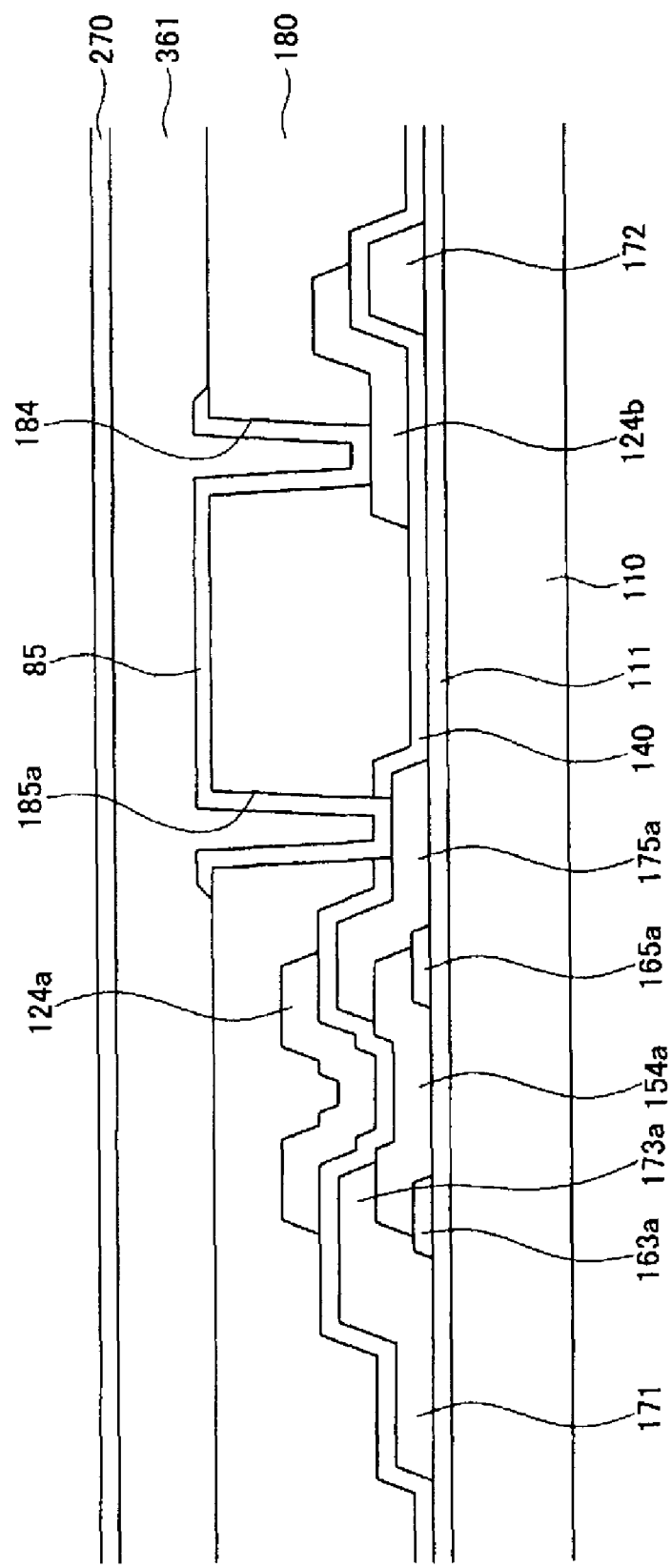
FIG. 3 is a sectional view of the organic light emitting device shown in FIG. 2 taken along the line III-III.
Figure 4:
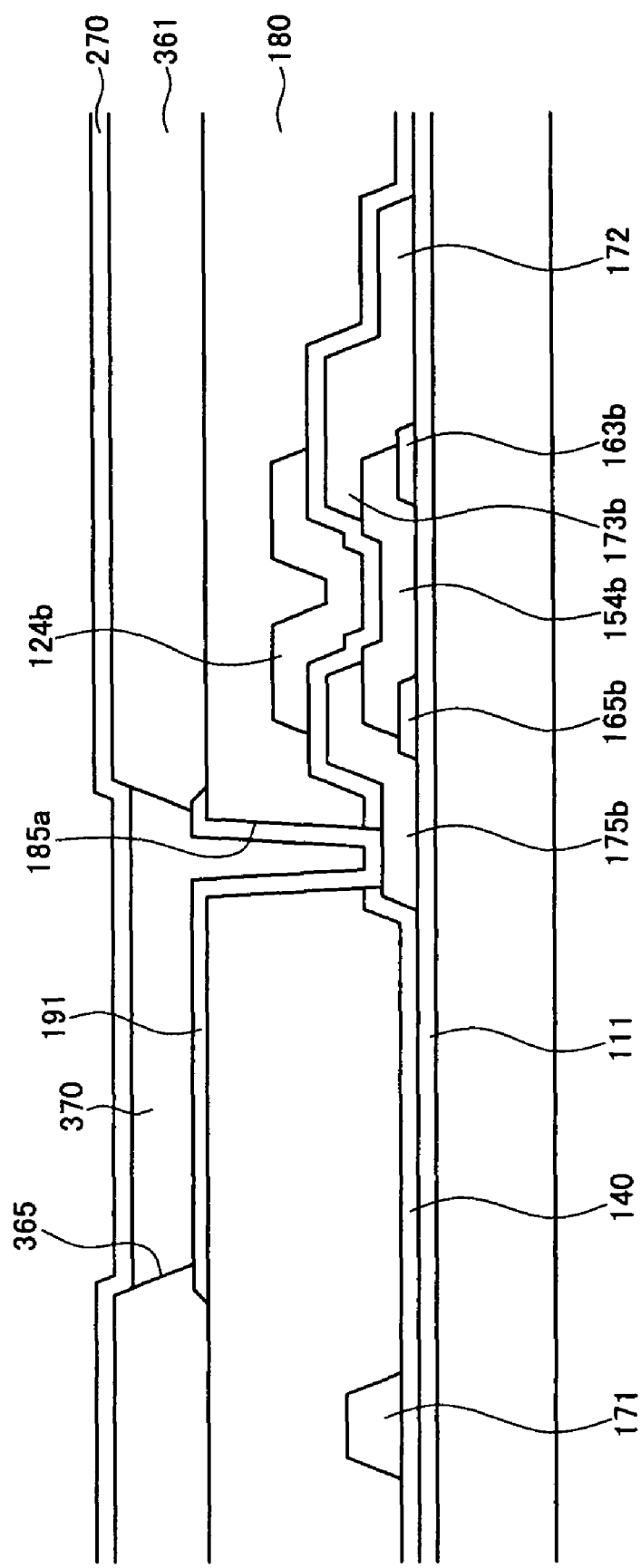
FIG. 4 is a sectional view of the organic light emitting device shown in FIG. 2 taken along the line IV-IV.

Referring to FIGS. 2 to 4, a detailed structure of the organic light emitting device shown in FIG. 1 according to an embodiment of the present invention will be described in detail.

FIG. 2 is a layout view of an organic light emitting device according to an embodiment of the present invention, FIG. 3 is a sectional view of the organic light emitting device shown in FIG. 2 taken along the line III-III, and FIG. 4 is a sectional view of the organic light emitting device shown in FIG. 2 taken along the line IV-IV.

A insulating layer 111 made of silicon oxide ($SiO_x$) or silicon nitride (SiNx) is formed on an insulating substrate 110 made of transparent glass or plastic. The insulating layer 111 may have a double-layered structure.

A plurality of pairs of switching ohmic contacts 163a and 165a and a plurality of pairs of driving ohmic contacts 163b and 165b are formed on the insulating layer 111. The switching ohmic contacts 163a and 165a and the driving ohmic contacts 163b and 165b are island-shaped and separated from each other, respectively. Each pair of the switching ohmic contact islands 163a and 165a are disposed opposite each other, and each pair of the driving ohmic contact islands 163b and 165b are disposed opposite each other.

The ohmic contacts 163a, 165a, 163b, and 165b are preferably made of n+ hydrogenated a-Si heavily doped with an n-type impurity such as phosphorous, or from polysilicon also heavily doped with an n-type impurity such as phosphorous; or the ohmic contacts 163a, 165a, 163b, and 165b may be made of silicide.

A plurality of switching semiconductors 154a are formed on the switching ohmic contacts 163a and 165a, and a plurality of driving semiconductors 154b are formed on the driving ohmic contacts 163b and 165b. Each switching semiconductor 154a connects the switching ohmic contacts 163a and 165a to each other, and each driving semiconductor 154b connects the driving ohmic contacts 163b and 165b to each other.

The switching semiconductor 154a and the driving semiconductor 154b may be made of polysilicon. Meanwhile, polysilicon having a drain size of about 10 E-6 m may be referred to as 'microcrystalline silicon'.

A plurality of data conductors including a plurality of data lines 171, a plurality of driving voltage lines 172, a plurality of switching output electrodes 175a, and a plurality of driving output electrodes 175b are formed on the substrate 110, the switching semiconductors 154a, the driving semiconductors 154b, and the ohmic contacts 163a, 165a, 163b, and 165b.

The data lines 171 transmit data signals and extend substantially in the longitudinal direction. Each data line 171 includes a plurality of switching input electrodes 173a extending toward the switching semiconductors 154a and an end portion (not shown) having a large area for contact with another layer or an external driving circuit. The data lines 171 may extend to be directly connected to a data driving circuit (not shown) for generating the data signals, which may be integrated on the substrate 110.

Each switching input electrode 173a is directly contacted to the switching semiconductor 154a and the exposed switching ohmic contact island 163a.

The driving voltage lines 172 transmit driving voltages and extend substantially in the longitudinal direction. Each driving voltage line 172 includes a plurality of driving input electrodes 173b extending toward the driving semiconductors 154b.

The driving input electrode 173b is directed contacted with the driving semiconductor 154b and the exposed driving ohmic contact 163b.

The switching output electrode 175a and the driving output electrode 175b are separated from each other, and are separated from the data line 171 and the driving voltage line 172.

The switching output electrode 175a is directly contacted with the switching semiconductor 154a and the switching ohmic contact 165a, and the driving output electrode 175b is directly contacted with the driving semiconductor 154b and the driving ohmic contact 165b. Each pair of the switching input electrode 173a and the switching output electrode 175a are disposed opposite each other with respect to the switching semiconductor 154a, and each pair of the driving input electrode 173b and the driving output electrode 175b are disposed opposite each other with respect to the driving semiconductor 154b.

The data conductors 171, 172, 175a, and 175b may be made of a refractory metal such as Mo, Cr, Ta, Ti, or alloys thereof. They may have a multi-layered structure including a refractory metal film (not shown) and a low resistivity conductive film (not shown).

The data conductors 171, 172, 175a, and 175b have inclined edge profiles, and the inclination angles thereof range from about 30 to about 80 degrees.

The ohmic contacts 163a, 165a, 163b, and 165b and the data conductors 171, 172, 175a, and 175b have different planar shapes from each other, however they may have substantially the same planar shape to each other by forming them using one mask.

A gate insulating layer 140 made of silicon nitride $SiN_x$ or silicon oxide $SiO_x$ is formed on the data conductors 171, 172, 175a, and 175b, and on the switching and driving semiconductors 154a and 154b.

A plurality of gate conductors including a plurality of gate lines 121 including switching control electrodes 124a and a plurality of driving control electrodes 124b are formed on the gate insulating layer.

The gate lines 121 for transmitting gate signals extend substantially in a transverse direction and intersect the data lines 171. Each gate line 121 further includes an end portion 129 having a large area for contact with another layer or an external driving circuit, and the switching control electrode 124a projects upward from the gate line 121. The gate lines 121 may extend to be directly connected to a gate driving circuit (not shown) for generating the gate signals, which may be integrated on the substrate 110.

The driving control electrodes 124b are separated from the gate lines 121. Each driving control electrode 124b includes a storage electrode 127 extending downward, turning to the right, and extending upward. The storage electrode 127 overlaps the driving voltage line 172.

The gate conductors 121 and 124b are preferably made of an Al-containing metal such as Al and an Al alloy, Ag-containing metal such as Ag and a Ag alloy, a Cu-containing metal such as Cu and a Cu alloy, a Mo-containing metal such as Mo and a Mo alloy, Cr, Ta, Ti, etc. However, they may have a multi-layered structure including two films having different physical characteristics. One of the two films may be made of a low resistivity metal including an Al-containing metal, a Ag-containing metal, and a Cu-containing metal for reducing signal delay or voltage drop. The other film may be made of material such as a Mo-containing metal, Cr, Ta, or Ti, which has good physical, chemical, and electrical contact characteristics with other materials such as indium tin oxide (ITO) or indium zinc oxide (IZO). Good examples of the combination of the two films are a lower Cr film and an upper Al (alloy) film, and a lower Al (alloy) film and an upper Mo (alloy) film. However, the gate conductors 121 and 124b may be made of various metals or conductors.

The lateral sides of gate conductors 121 and 124b are inclined relative to a surface of the substrate 110, and the inclination angle thereof ranges about 30-80 degrees.

A passivation layer 180 is formed on the gate conductors 121 and 124b.

The passivation layer 180 may be made of inorganic or organic insulator and it may have a flat top surface. Examples of the inorganic insulator include silicon nitride and silicon oxide. The organic insulator may have photosensitivity and a dielectric constant less than about 4.0. The passivation layer 180 may include a lower film of an inorganic insulator and an upper film of an organic insulator.

The passivation layer 180 has a plurality of contact holes 184 exposing the driving control electrodes 124b, and the passivation layer 180 and gate insulating layer 140 have a plurality of contact holes 185a and 185b exposing the switching and driving output electrodes 175a and 175b, respectively.

A plurality of pixel electrodes 191 and a plurality of connecting members 85 are formed on the passivation layer 180. The pixel electrodes 191 and the connecting members 85 may be made of a transparent conductor such as ITO or IZO, or an opaque conductor such as Al, Ag, or alloys thereof.

The pixel electrodes 191 are physically and electrically connected to the driving output electrodes 175b through the contact holes 185b, and the connecting members 85 are connected to the driving control electrodes 124b and switching output electrodes 175a through the contact holes 184 and 185a, respectively.

A partition 361 is formed on the pixel electrodes 191. The partition 361 surrounds the pixel electrode 191 like a bank to define openings 365, and may be made of an organic insulator or an inorganic insulator. The partition 361 may be made of a photosensitive material containing black pigment so that the black partition 361 may serve as a light blocking member and the formation of the partition 361 may be simplified.

A plurality of light emitting members 370 are formed on the pixel electrodes 191 and confined in the openings 365 defined by the partition 361. Each of the light emitting members 370 is preferably made of an organic material uniquely emitting light of one of the primary colors, such as red, green, and blue light. The organic light emitting device forms images by spatially adding the monochromatic primary color lights emitted from the light emitting members 370.

Each of the light emitting members 370 may have a multi-layered structure including an emitting layer (not shown) for emitting light and auxiliary layers (not shown) for improving the efficiency of light emission of the emitting layer. The auxiliary layers may include an electron transport layer (not shown) and a hole transport layer (not shown) for improving the balance of the electrons and holes, and an electron injecting layer (not shown) and a hole injecting layer (not shown) for improving the injection of the electrons and holes.

The common electrode 270 is formed on the light emitting members 370 and the partitions 361. The common electrode 270 is supplied with a common voltage Vss, and may be made of a conductive material such as ITO, IZO, etc.

In the above-described organic light emitting device, a switching control electrode 124a connected to a gate line 121, a switching input electrode 173a connected to a data line 171, and a switching output electrode 175a along with a switching semiconductor 154a form a switching thin film transistor Qs having a channel formed in the switching semiconductor 154a disposed between the switching input electrode 173a and the switching output electrode 175a.

Likewise, a driving control electrode 124b connected to a switching output electrode 175a, a driving input electrode 173b connected to a driving voltage line 172, and a driving output electrode 175b connected to a pixel electrode 191 along with a driving semiconductor 154b form a driving thin film transistor Qd having a channel formed in the driving semiconductor 154b disposed between the driving input electrode 173b and the driving output electrode 175b.

A pixel electrode 191, a light emitting member 370, and the common electrode 270 form an organic light emitting diode LD having the pixel electrode 191 as an anode and the common electrode 270 as a cathode or vice versa. The overlapping portions of the storage electrode 127 and the driving voltage line 172 form a storage capacitor Cst.

The organic light emitting device emits light toward the top or bottom of the substrate 110 to display images. A combination of opaque pixel electrodes 191 and a transparent common electrode 270 is employed with a top emission organic light emitting device that emits light toward the top of the substrate 110, and a combination of transparent pixel electrodes 191 and an opaque common electrode 270 is employed with a bottom emission organic light emitting device that emits light toward the bottom of the substrate 110.

Now, a manufacturing method of the organic light emitting device shown in FIG. 2 to FIG. 4 is described with reference to FIG. 5 to FIG. 19 along with FIG. 2 to FIG. 4.

Figure 5:
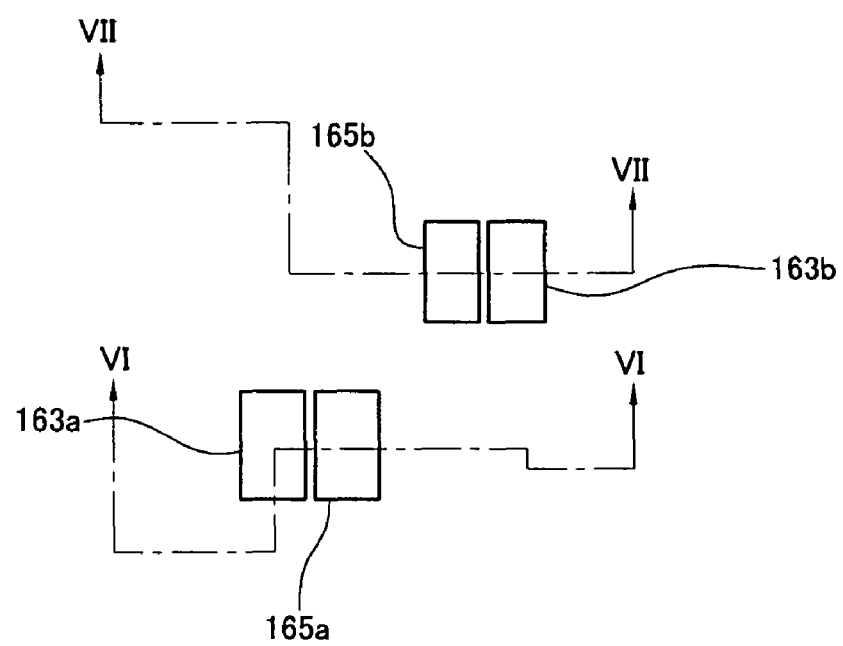
FIGS. 5, 8, 11, 14, and 17 are layout views of the organic light emitting device shown in FIGS. 2-4 in intermediate steps of a manufacturing method thereof according to an embodiment of the present invention.
Figure 6:
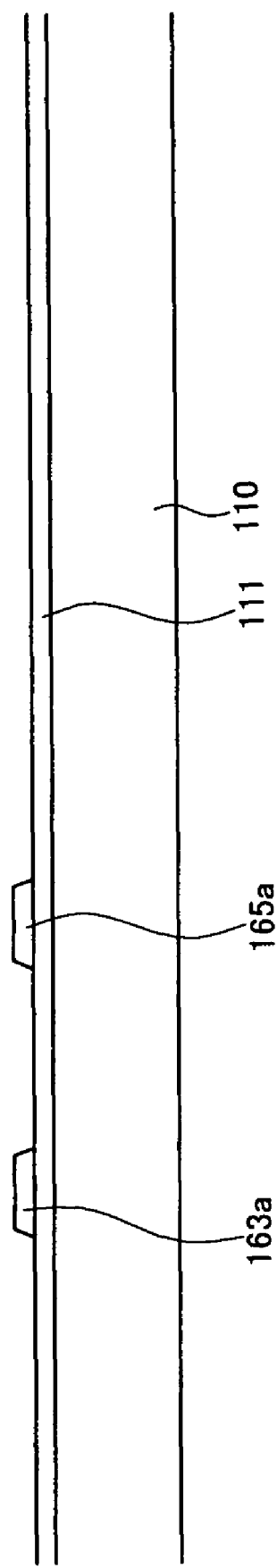
FIG. 6 is a sectional view of the organic light emitting device shown in FIG. 5 taken along the line VI-VI.
Figure 7:
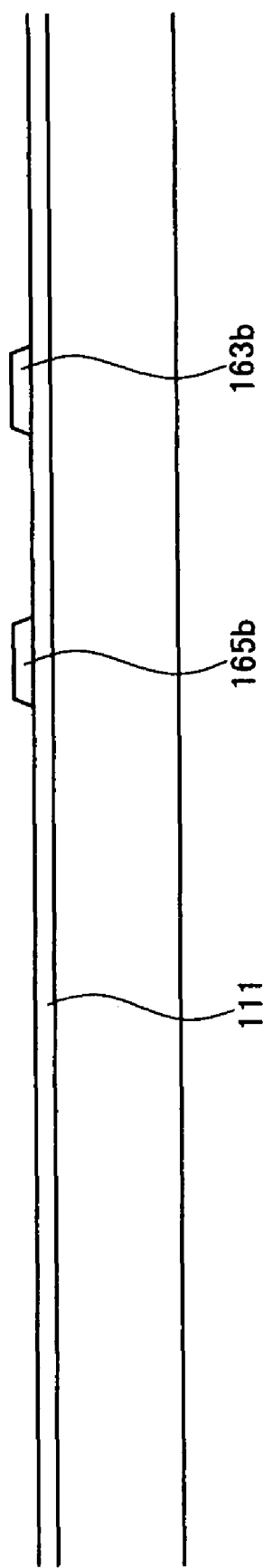
FIG. 7 is a sectional view of the organic light emitting device shown in FIG. 5 taken along the line VII-VII.
Figure 8:
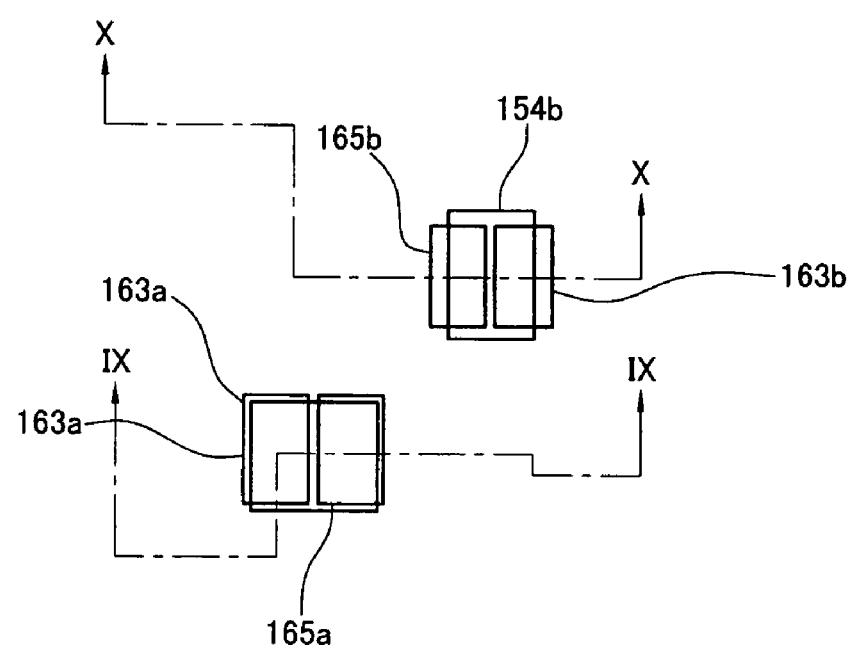
Figure 9:
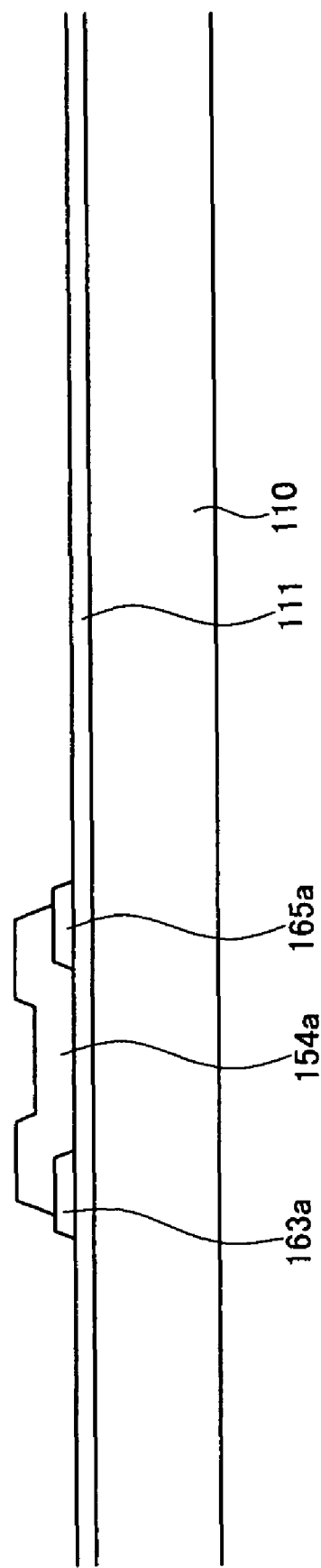
FIG. 9 is a sectional view of the organic light emitting device shown in FIG. 8 taken along the line IX-IX.
Figure 10:
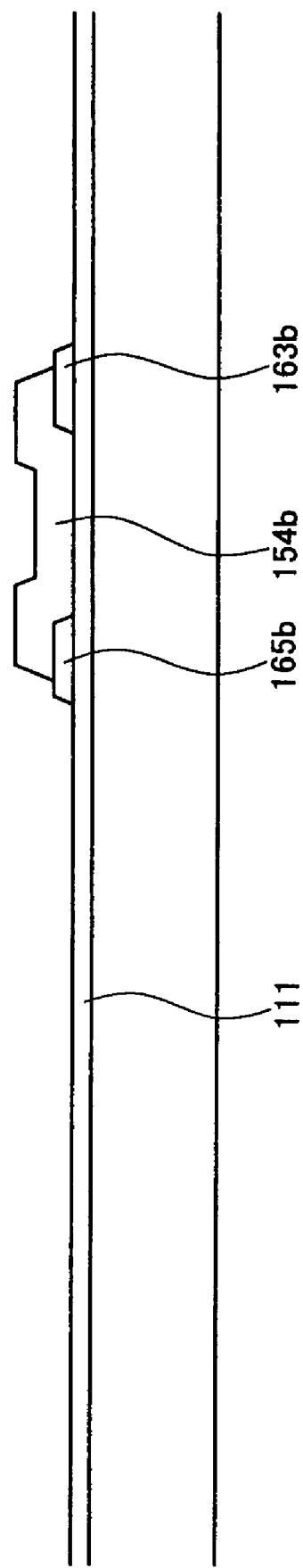
FIG. 10 is a sectional view of the organic light emitting device shown in FIG. 8 taken along the line X-X.
Figure 11:
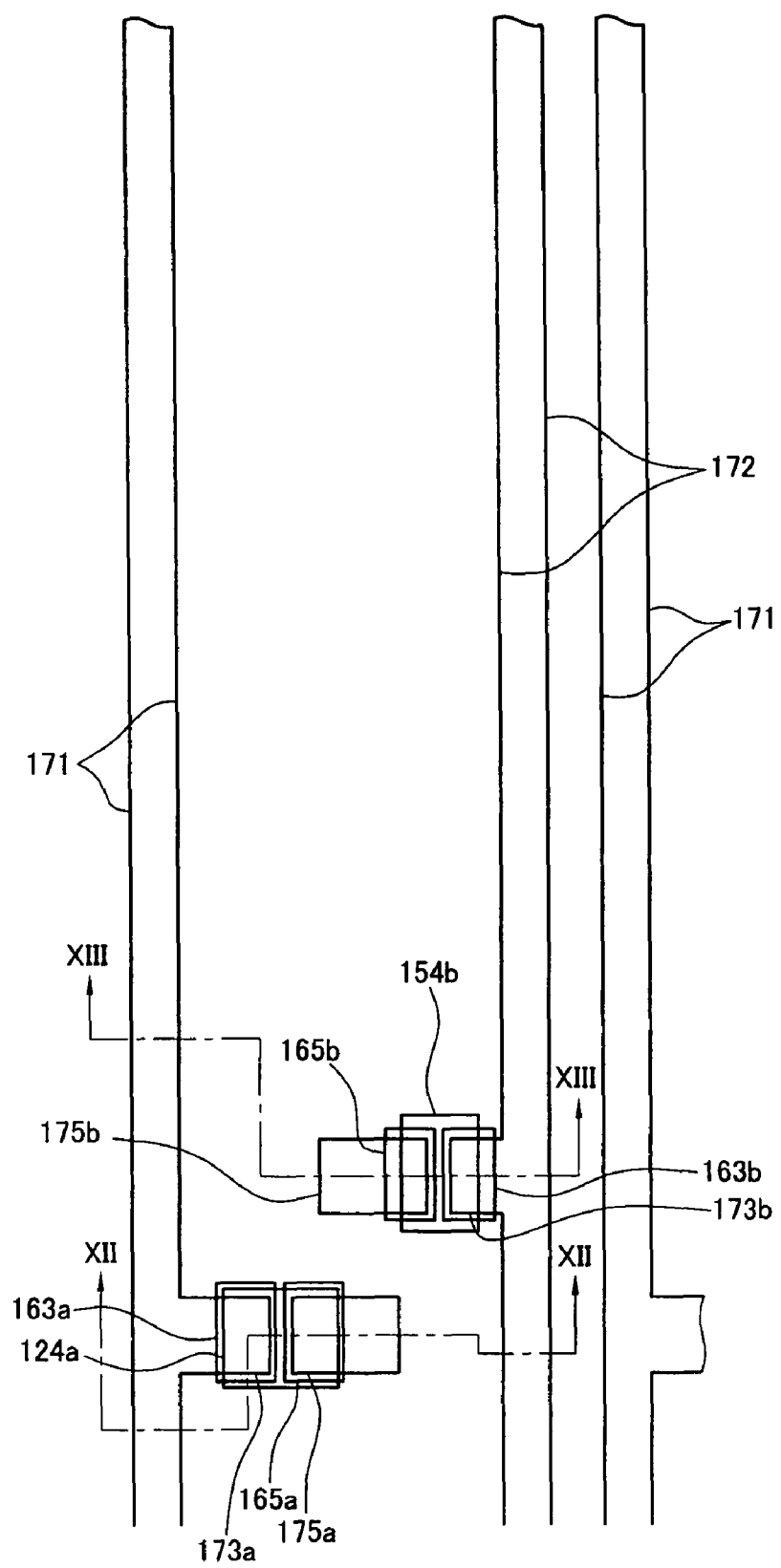
Figure 12:
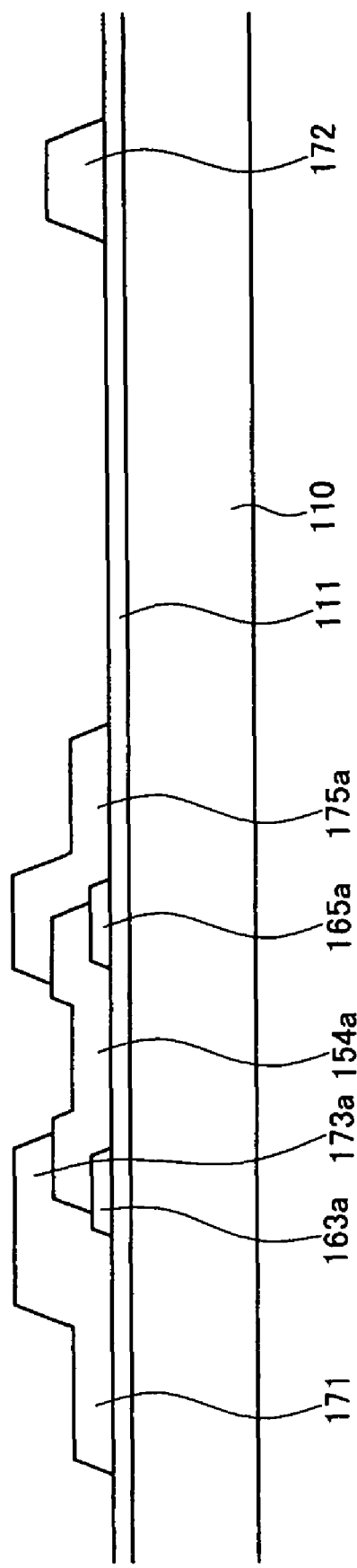
FIG. 12 is a sectional view of the organic light emitting device shown in FIG. 11 taken along the line XII-XII.
Figure 13:
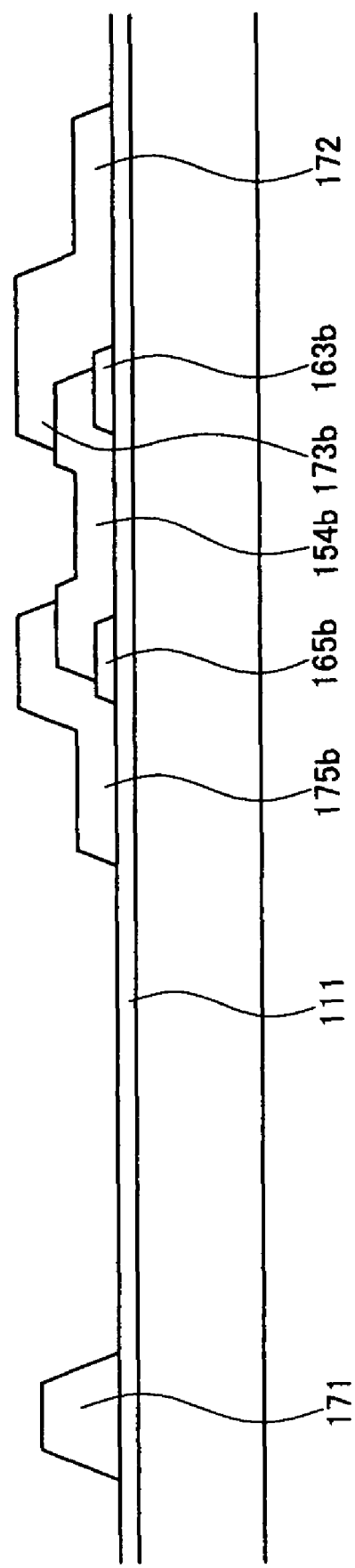
FIG. 13 is a sectional view of the organic light emitting device shown in FIG. 11 taken along the line XIII-XIII.
Figure 14:
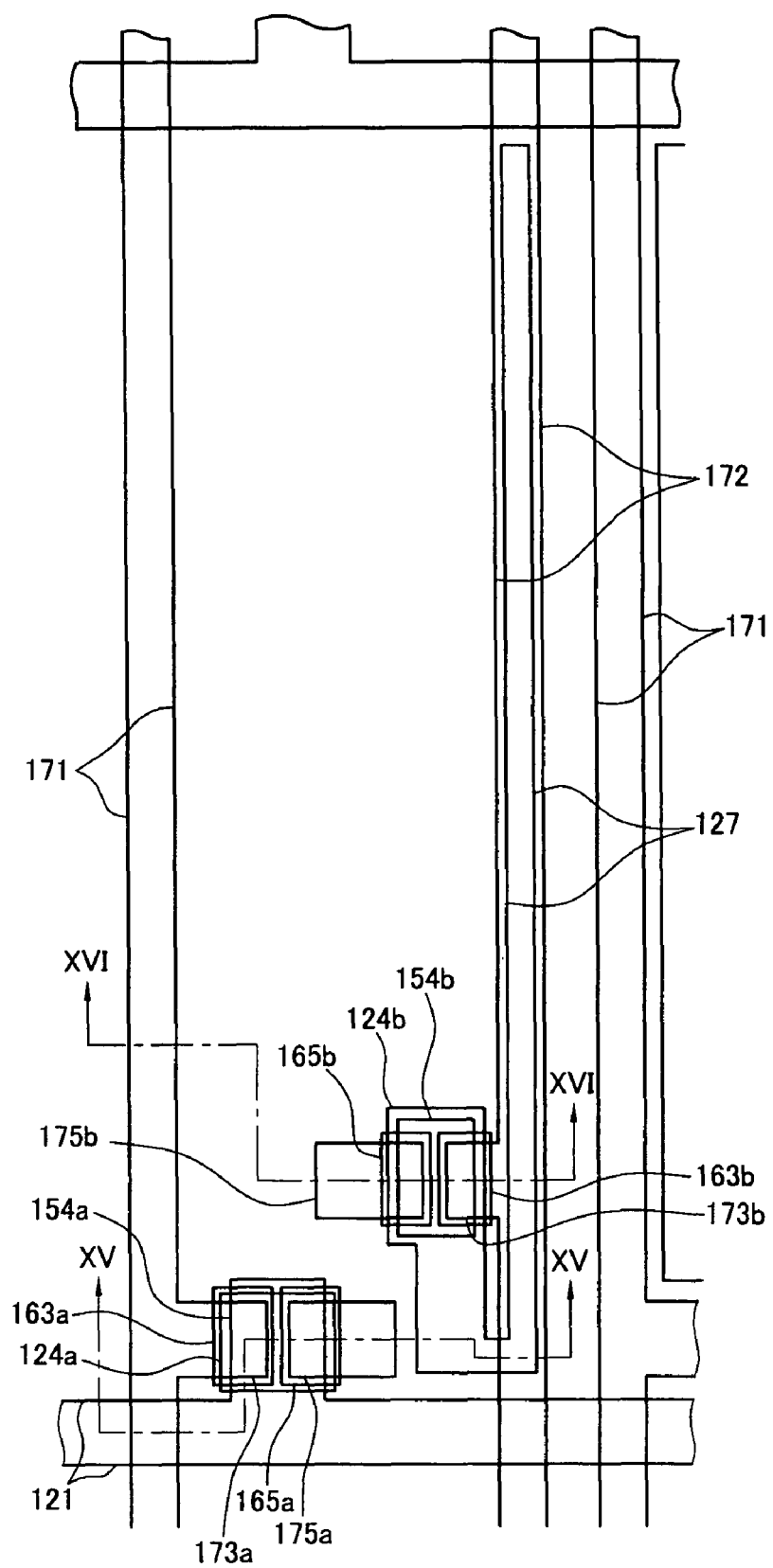
Figure 15:
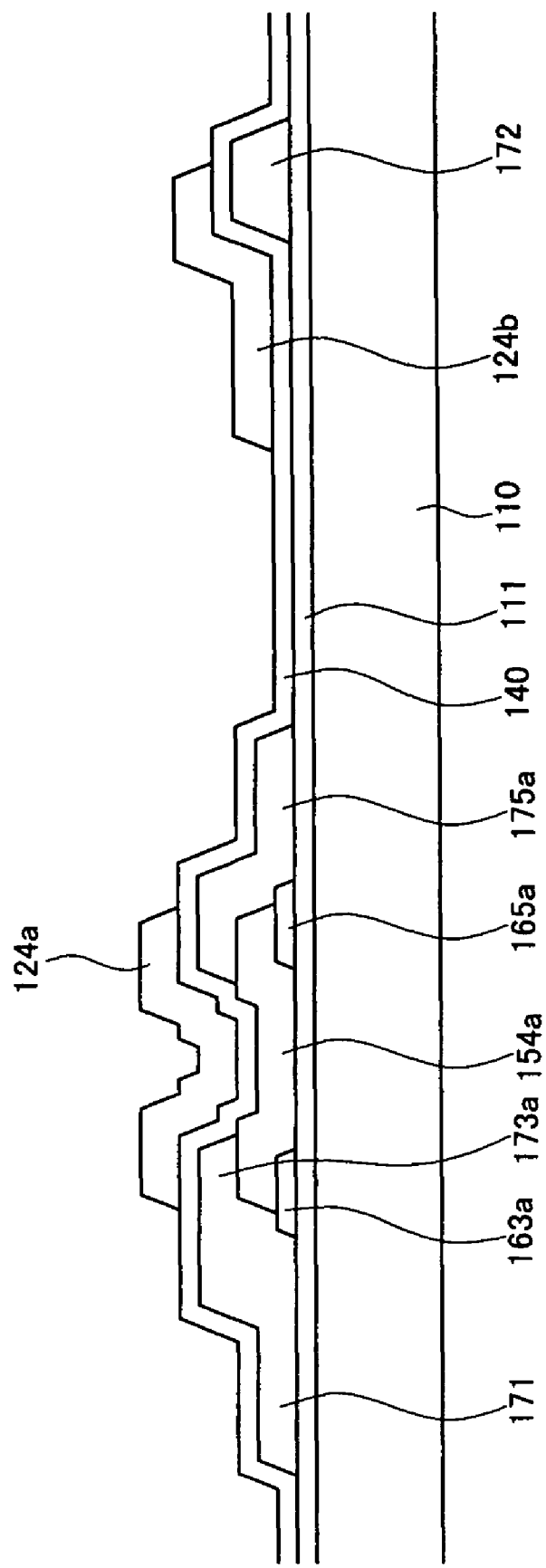
FIG. 15 is a sectional view of the organic light emitting device shown in FIG. 14 taken along the line XV-XV.
Figure 16:
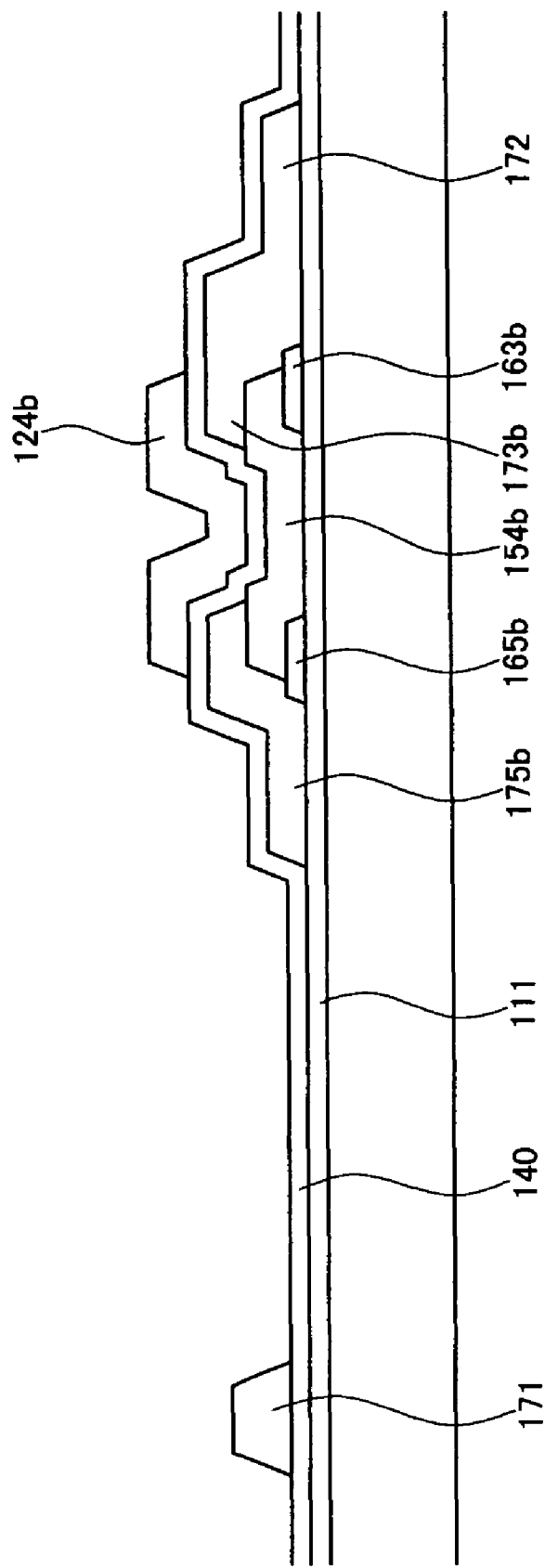
FIG. 16 is a sectional view of the organic light emitting device shown in FIG. 14 taken along the line XVI-XVI.
Figure 17:
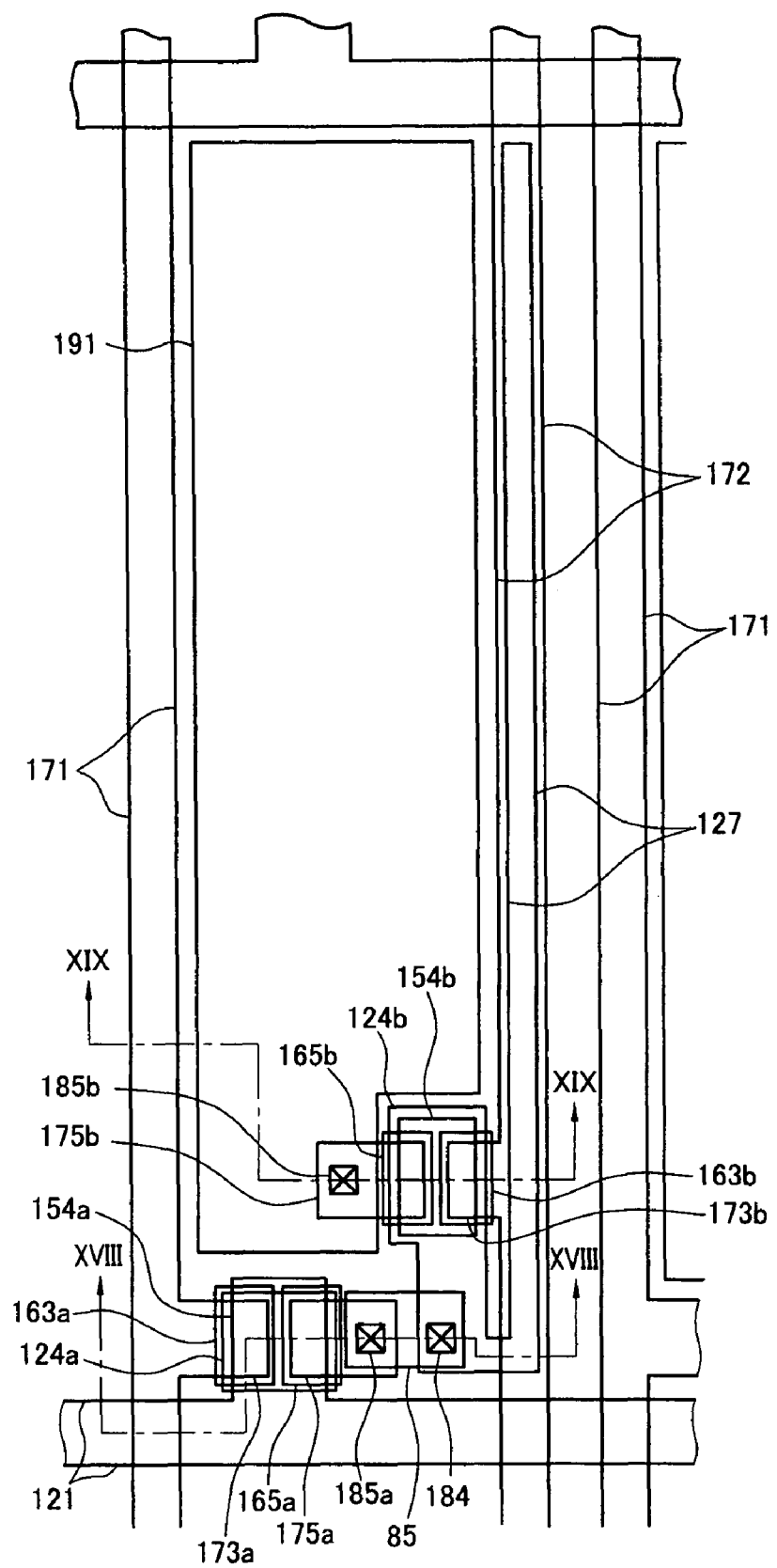
Figure 18:
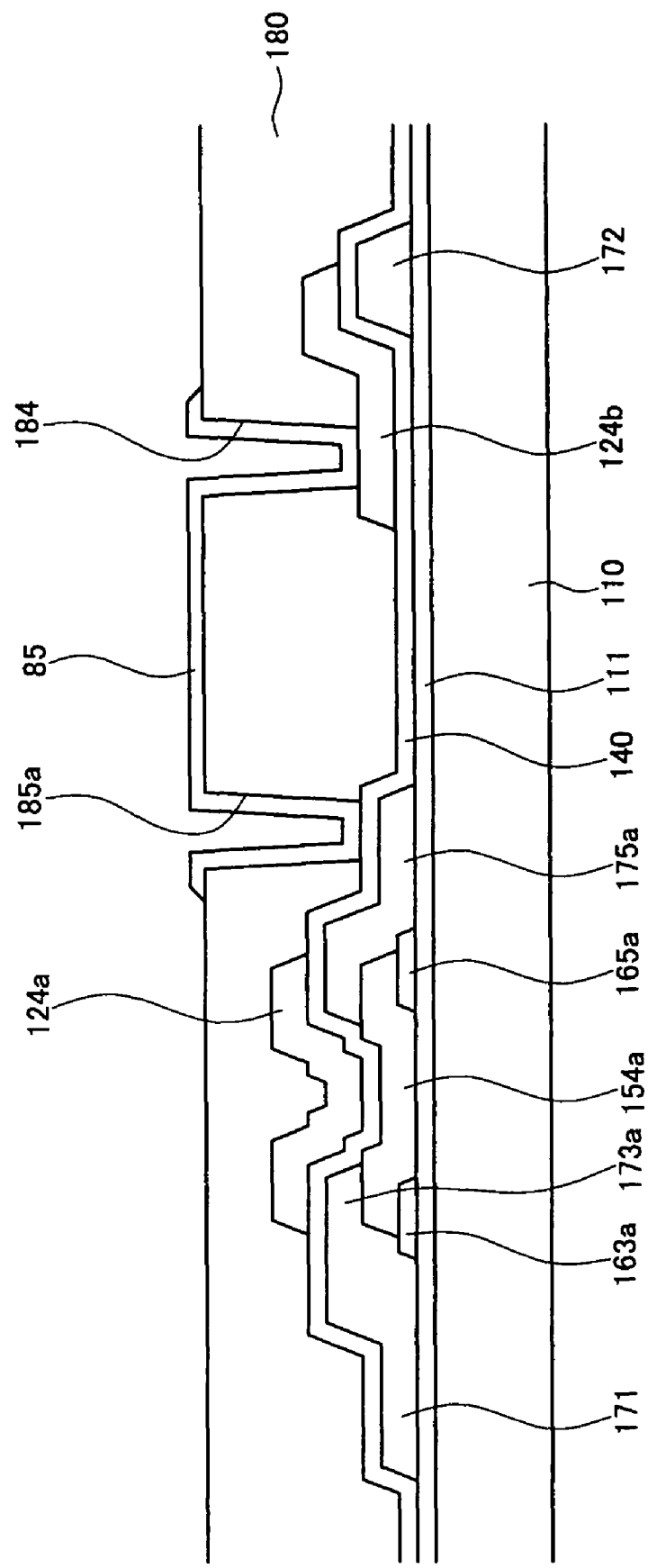
FIG. 18 is a sectional view of the organic light emitting device shown in FIG. 17 taken along the line XVIII-XVIII.
Figure 19:
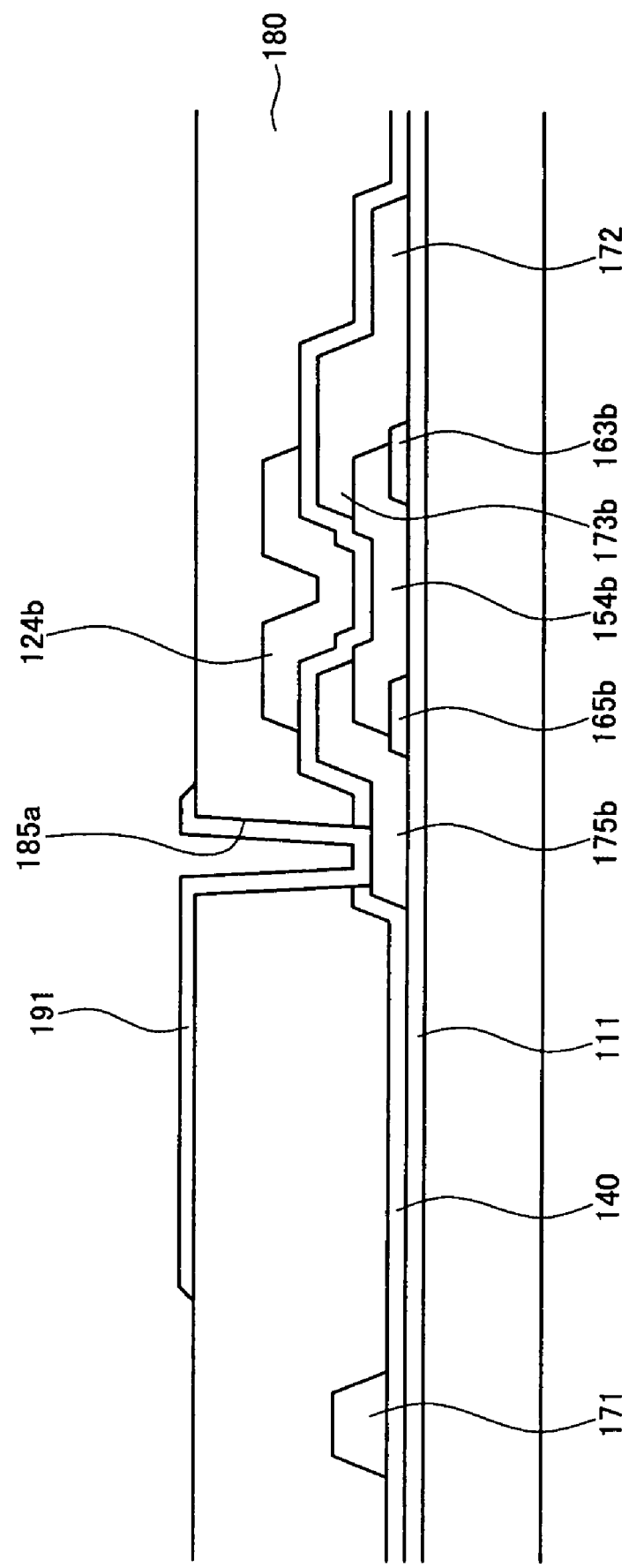
FIG. 19 is a sectional view of the organic light emitting device shown in FIG. 17 taken along the line XIX-XIX.

FIGS. 5, 8, 11, 14, and 17 are layout views of the organic light emitting device shown in FIGS. 2 to 4 in intermediate steps of a manufacturing method thereof according to an embodiment of the present invention, FIG. 6 is a sectional view of the organic light emitting device shown in FIG. 5 taken along the line VI-VI, FIG. 7 is a sectional view of the organic light emitting device shown in FIG. 5 taken along the line VII-VII, FIG. 9 is a sectional view of the organic light emitting device shown in FIG. 8 taken along the line IX-IX, FIG. 10 is a sectional view of the organic light emitting device shown in FIG. 8 taken along the line X-X, FIG. 12 is a sectional view of the organic light emitting device shown in FIG. 11 taken along the line XII-XII, FIG. 13 is a sectional view of the organic light emitting device shown in FIG. 11 taken along the line XIII-XIII, FIG. 15 is a sectional view of the organic light emitting device shown in FIG. 14 taken along the line XV-XV, FIG. 16 is a sectional view of the organic light emitting device shown in FIG. 14 taken along the line XVI-XVI, FIG. 18 is a sectional view of the organic light emitting device shown in FIG. 17 taken along the line XVIII-XVIII, and FIG. 19 is a sectional view of the organic light emitting device shown in FIG. 17 taken along the line XIX-XIX.

An insulator such as silicon oxide is deposited on a substrate 110 to form a insulating layer 111 as shown in FIG. 5 to FIG. 7. The blocking film may have a thickness of about 5000 Å.

Then, a first amorphous silicon layer doped with an impurity is deposited on the insulating layer 111 by chemical vapor deposition (CVD) etc., and then the deposited first amorphous silicon layer is patterned to form a plurality of switching and driving ohmic contacts 163a, 165a, 163b, and 165b. The first amorphous silicon may have a thickness of about 300 to 500 Å.

A second amorphous silicon is deposited on the switching and driving ohmic contacts 163a, 165a, 163b, and 165b by chemical vapor deposition (CVD), and then the deposited second amorphous silicon is patterned to form a plurality of switching and driving semiconductors 154a and 154b as shown in FIG. 8 to FIG. 10.

Thereafter, the switching and driving semiconductors 154a and 154b are subjected to heat treatment to be crystallized. The crystallization may be performed by solid phase crystallization (SPC), excimer laser annealing (ELA), metal induced lateral crystallization (MILC), etc., and SPC may be preferably used. Here, the ohmic contacts 163a, 165a, 163b, and 165b may be crystallized concurrently. Meanwhile, polysilicon having a drain size of about 10 E-6 m may be referred to as 'microcrystalline silicon'.

Next, a metal layer is deposited on the substrate 110 and is patterned to form a plurality of data lines 171 including switching input electrodes 173a, a plurality of driving voltage lines 172 including switching output electrodes 175a and driving input electrode 173b, and a plurality of driving output electrodes 175b as shown in FIG. 11 to FIG. 13.

According to an embodiment of the present invention, the ohmic contacts 163a, 165a, 163b, and 165b and the data conductors 171, 172, 175a, and 175b are formed using separate masks, however the ohmic contacts 163a, 165a, 163b, and 165b and the data conductors 171, 172, 175a, and 175b may be formed using one mask.

When separate masks are used, the ohmic contacts 163a, 163b, 165a, and 165b are formed only under the switching and driving input electrodes 173a and 173b and the switching and driving output electrodes 175a and 175b. However, the ohmic contacts may be formed under the data lines 171 and the driving voltage lines 172 if just one mask is used.

Referring to FIG. 14 to FIG. 16, a gate insulating layer 140 is formed on the data conductors 171, 172, 175a, and 175b.

Then, a metal layer is deposited on the gate insulating layer 140 by sputtering, etc., and the deposited metal layer is patterned to form a plurality of gate conductors 121 and 124b including a plurality of gate lines 121 including switching control electrodes 124a, and a plurality of driving control electrodes 124b including storage electrodes 127.

As shown in FIG. 17 to FIG. 19, a passivation layer 180 is deposited on the gate conductors 121 and 124b and patterned to form a plurality of contact holes 184, 185a, and 185b.

Then a transparent conductive layer such as ITO is deposited on the passivation layer 180 and patterned to form a plurality of pixel electrodes 191 and a plurality of connecting members 85.

Next, an organic insulating layer or inorganic insulating layer is coated, exposed, and developed to form a partition 361 having a plurality of openings 365 on the pixel electrodes 191 as shown in FIG. 2 to FIG. 4.

A plurality of light emitting members 370 are formed in the openings 365. The light emitting members 370 may be formed by a solution process such as inkjet printing, or evaporation.

Thereafter, a common electrode 270 is formed on the partition 361 and the light emitting members 370.

As described above, unlike the thin film transistor of the known organic light emitting device including ohmic contacts disposed between an intrinsic semiconductor of a channel and data conductors, formation of the thin film transistor of the organic light emitting device according to the embodiment of the present invention includes forming ohmic contacts on the gate insulating layer, forming an intrinsic semiconductor, which is a channel of the thin film transistor, on portions of the ohmic contacts and the gate insulating layer, and forming data conductors on the ohmic contacts not covered by the semiconductor such that the intrinsic semiconductor of the thin film transistor may not damaged by etching for forming the ohmic contacts.

Now, an organic light emitting device according to a second embodiment of the present invention will be described with reference to FIG. 20 to FIG. 22.

Figure 20:
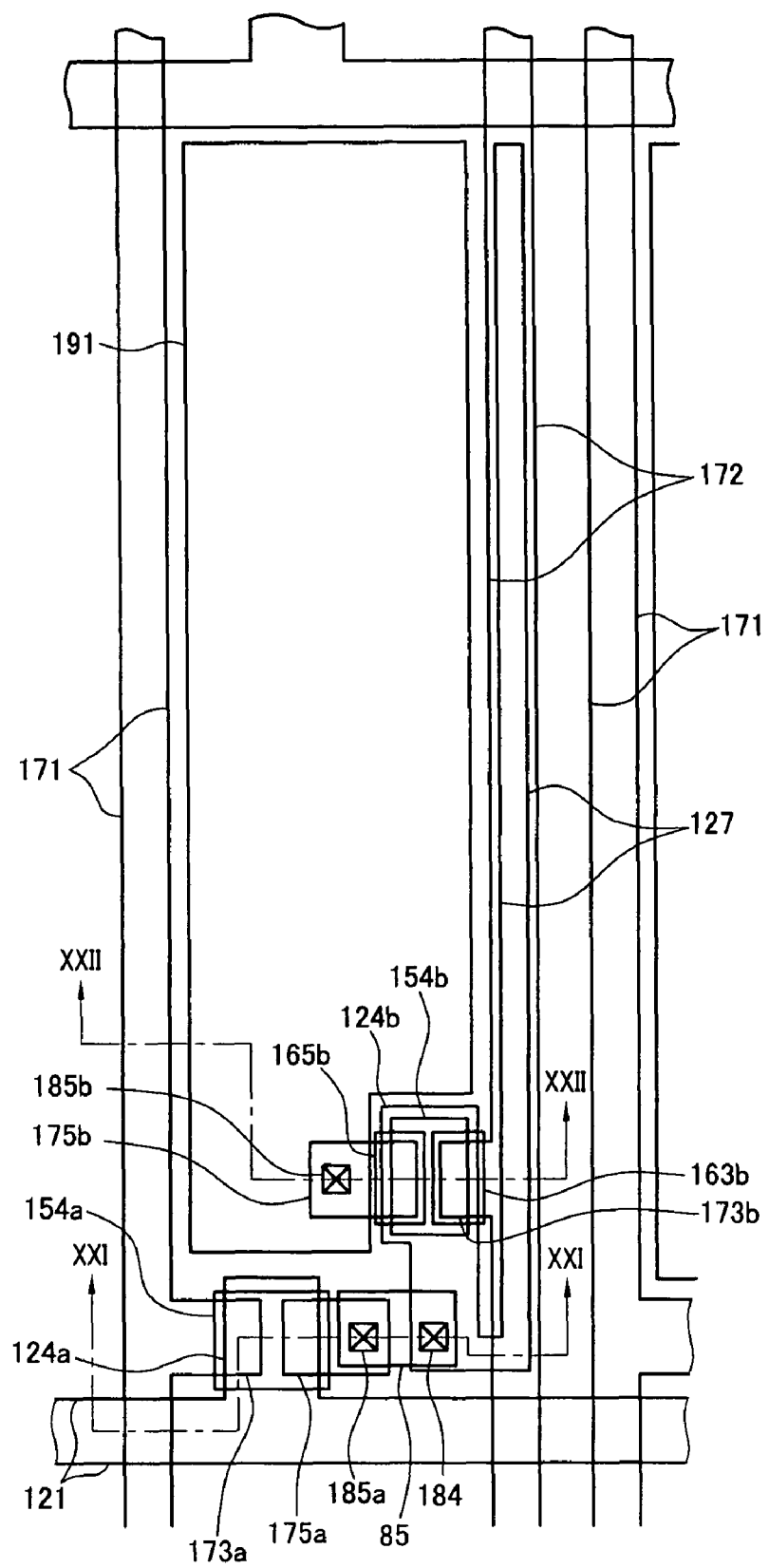
FIG. 20 is a layout view of an organic light emitting device according to a second embodiment of the present invention.
Figure 21:
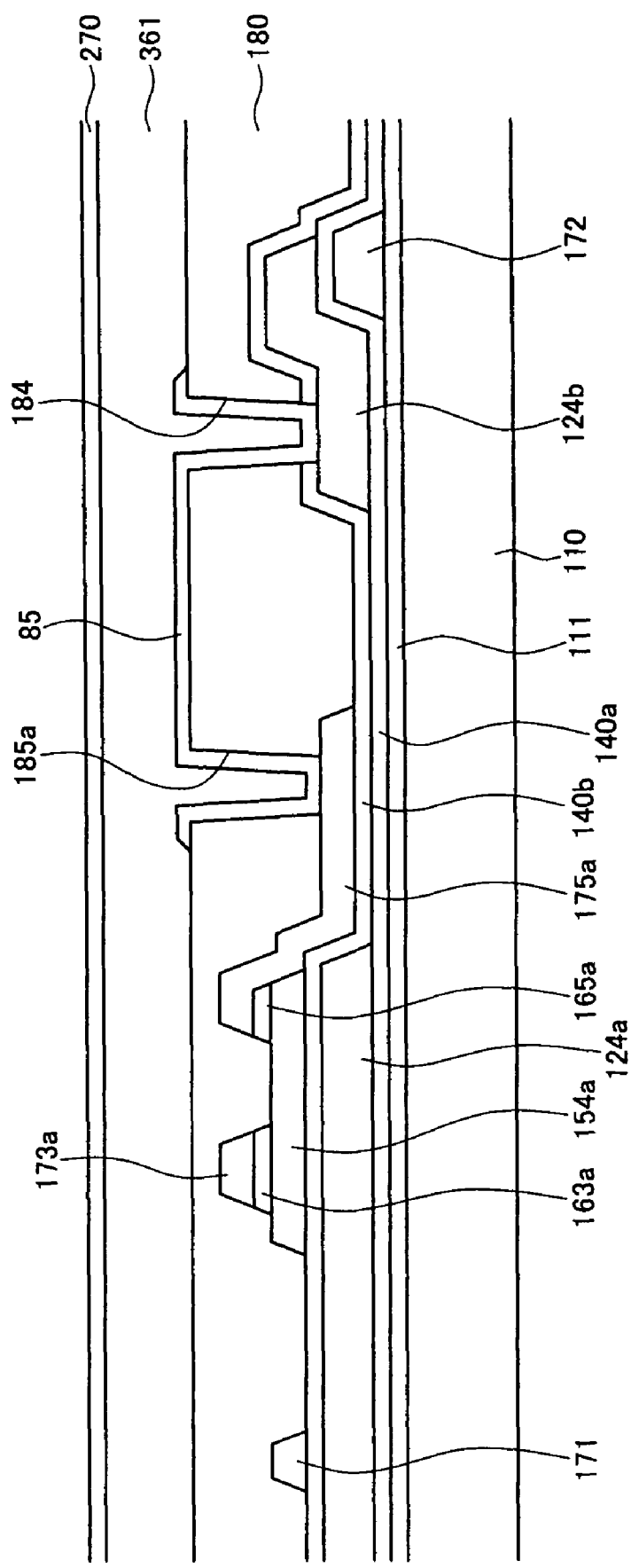
FIG. 21 is a sectional view of the organic light emitting device shown in FIG. 20 taken along the line XXI-XXI.
Figure 22:
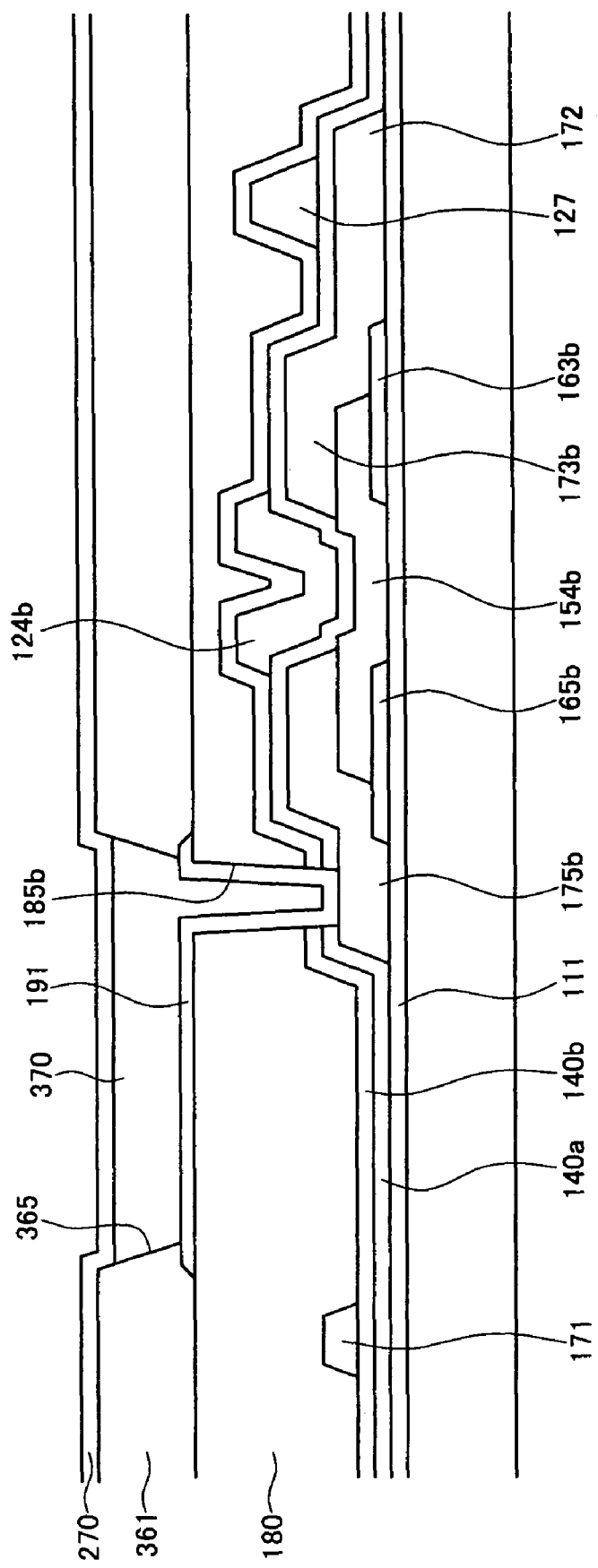
FIG. 22 is a sectional view of the organic light emitting device shown in FIG. 20 taken along the line XXII-XXII.

FIG. 20 is a layout view of an organic light emitting device according to another embodiment of the present invention, FIG. 21 is a sectional view of the organic light emitting device shown in FIG. 20 taken along the line XXI-XXI, and FIG. 22 is a sectional view of the organic light emitting device shown in FIG. 20 taken along the line XXII-XXII.

As shown in FIG. 20 to FIG. 22, a layered structure of an organic light emitting device according to the present embodiment is substantially the same as that shown in FIG. 2 to FIG. 4.

A insulating layer 111 is formed on an insulating substrate 110, and a plurality of pairs of driving ohmic contacts 163b and 165b are formed on the insulating layer 111. Each pair of the driving ohmic contacts 163b and 165b are disposed opposite each other.

A plurality of driving semiconductors 154b are formed on the driving ohmic contacts 163b and 165b. Each driving semiconductor 154b connects the driving ohmic contacts 163b and 165b to each other.

The driving semiconductor 154b may be made of polysilicon.

A plurality of driving voltage lines 172 including a plurality of driving input electrodes 173b, and a plurality of driving output electrodes 175b are formed on the substrate 110, the driving semiconductors 154b, and the driving ohmic contacts 163b and 165b.

The driving input electrode 173b is directed contacted with the driving semiconductor 154b and the exposed driving ohmic contact 163b. Each driving input electrode 173b and each driving output electrode 175b are directed contacted with the driving semiconductor 154b and the exposed ohmic contacts 163b and 165b.

A first gate insulating layer 140a made of silicon nitride ($SiN_x$) or silicon oxide ($SiO_x$) is formed on the driving voltage lines 172, the driving output electrodes 175b, and the driving semiconductor 154b.

A plurality of gate conductors including a plurality of gate lines 121 including switching control electrodes 124a and a plurality of driving control electrodes 124b including storage electrodes 127 are formed on the first gate insulating layer 140a.

The storage electrodes 127 overlap the driving voltage lines 172.

A second gate insulating layer 140b made of silicon nitride ($SiN_x$) or silicon oxide ($SiO_x$) is formed on the gate conductors 121 and 124b.

A plurality of switching semiconductors 154a made of amorphous silicon or polysilicon are formed on the second gate insulating layer. The switching semiconductors 154a are located on the switching control electrodes 124a.

A plurality of switching ohmic contacts 163a and 165a are formed on the switching semiconductors 154a. A plurality of data lines 171 and a plurality of switching output electrodes 175a are formed on the ohmic contacts 163a and 165a and the second gate insulating layer 140b.

The switching output electrodes 175a are separated from the data lines 171, and disposed opposite the switching input electrodes 173a with respect to switching control electrodes 124a.

A passivation layer 180 is formed on the data lines 171, the switching output electrodes 175a, and the second gate insulating layer 140b.

The passivation layer 180 and the second gate insulating layer 140b have a plurality of contact holes 184 exposing the driving control electrodes 124b, the passivation layer 180 has a plurality of contact holes 185a exposing the driving output electrodes 175b, and the passivation layer 180 and the first and second gate insulating layers 140a and 140b have a plurality of contact holes 185b exposing the switching output electrode 175b.

A plurality of pixel electrodes 191 and a plurality of connecting members 85 are formed on the passivation layer 180. The pixel electrodes 191 are physically and electrically connected to the driving output electrodes 175b through the contact holes 185b, and the connecting members 85 are connected to the driving control electrodes 124b and the switching output electrodes 175a through the contact holes 184 and 185a.

A partition 361 defining a plurality of openings 365 is formed on the pixel electrodes 191, and a plurality of organic light emitting members 370 are formed in the openings 365. A common electrode 270 is formed on the organic light emitting members 370.

Now, a manufacturing method of the organic light emitting device shown in FIG. 20 to FIG. 22 is described with reference to FIG. 23 to FIG. 43 along with FIG. 20 to FIG. 22.

Figure 23:
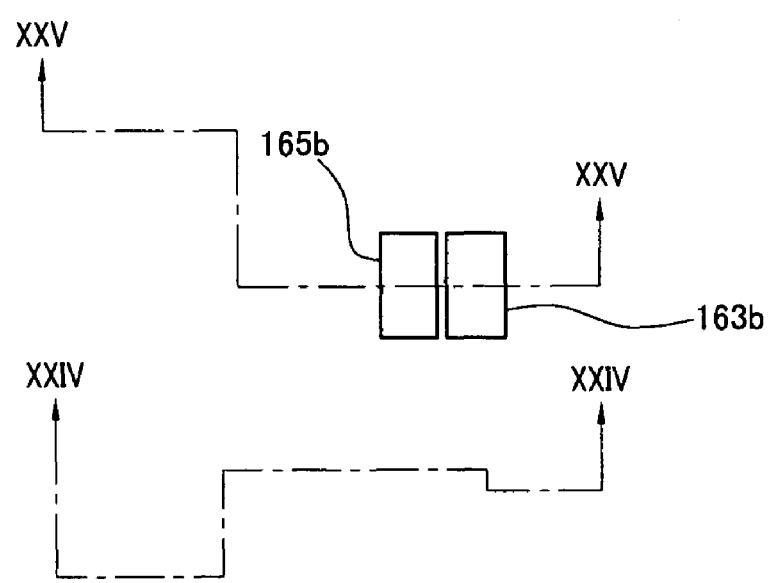
FIGS. 23, 26, 29, 32, 35, 38, and 41 are views of the organic light emitting device shown in FIGS. 20-22 in intermediate steps of a manufacturing method thereof according to an embodiment of the present invention.
Figure 24:
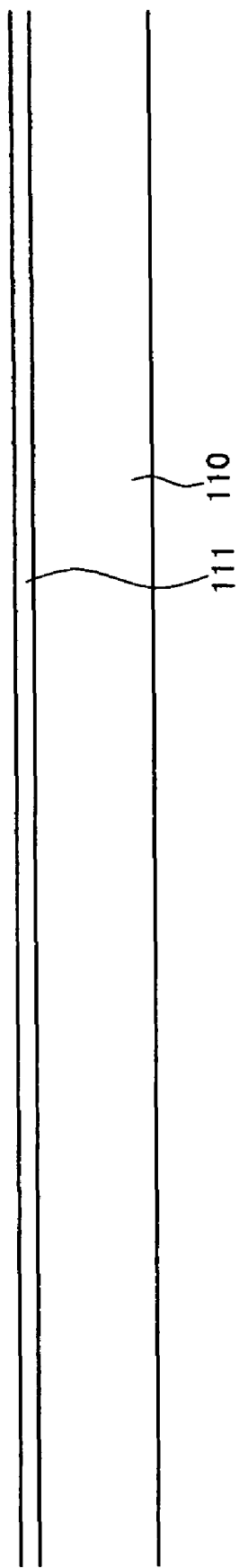
FIG. 24 is a sectional view of the organic light emitting device shown in FIG. 23 taken along the line XXIV-XXIV.
Figure 25:
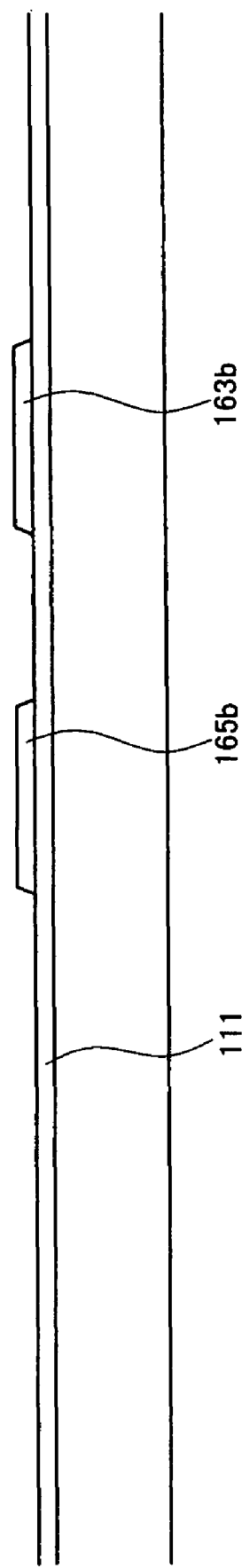
FIG. 25 is a sectional view of the organic light emitting device shown in FIG. 23 taken along the line XXV-XXV.
Figure 26:
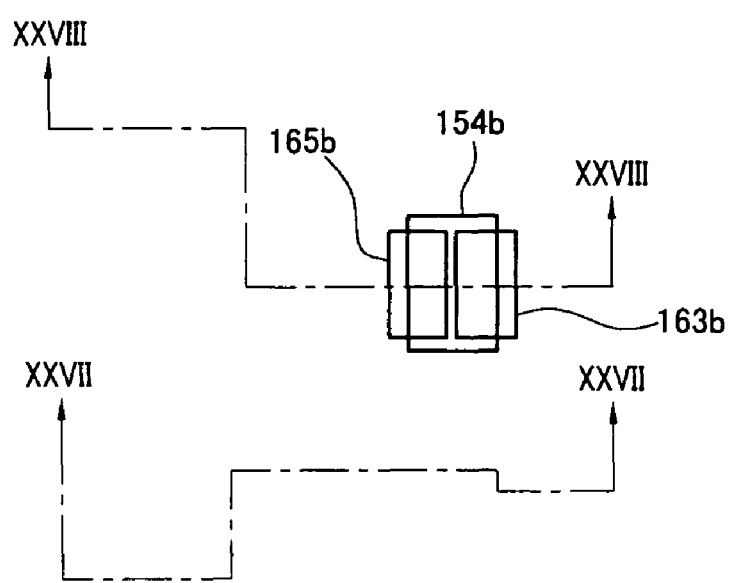
Figure 27:
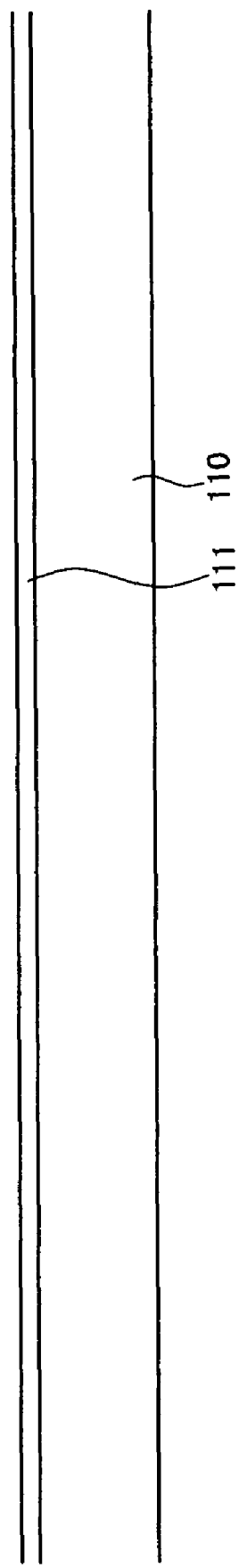
FIG. 27 is a sectional view of the organic light emitting device shown in FIG. 26 taken along the line XXVII-XXVII.
Figure 28:
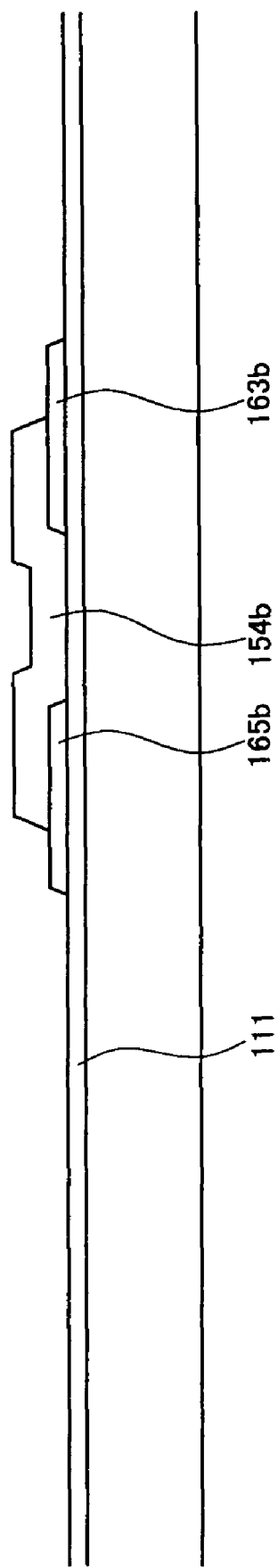
FIG. 28 is a sectional view of the organic light emitting device shown in FIG. 26 taken along the line XXVIII-XXVIII.
Figure 29:
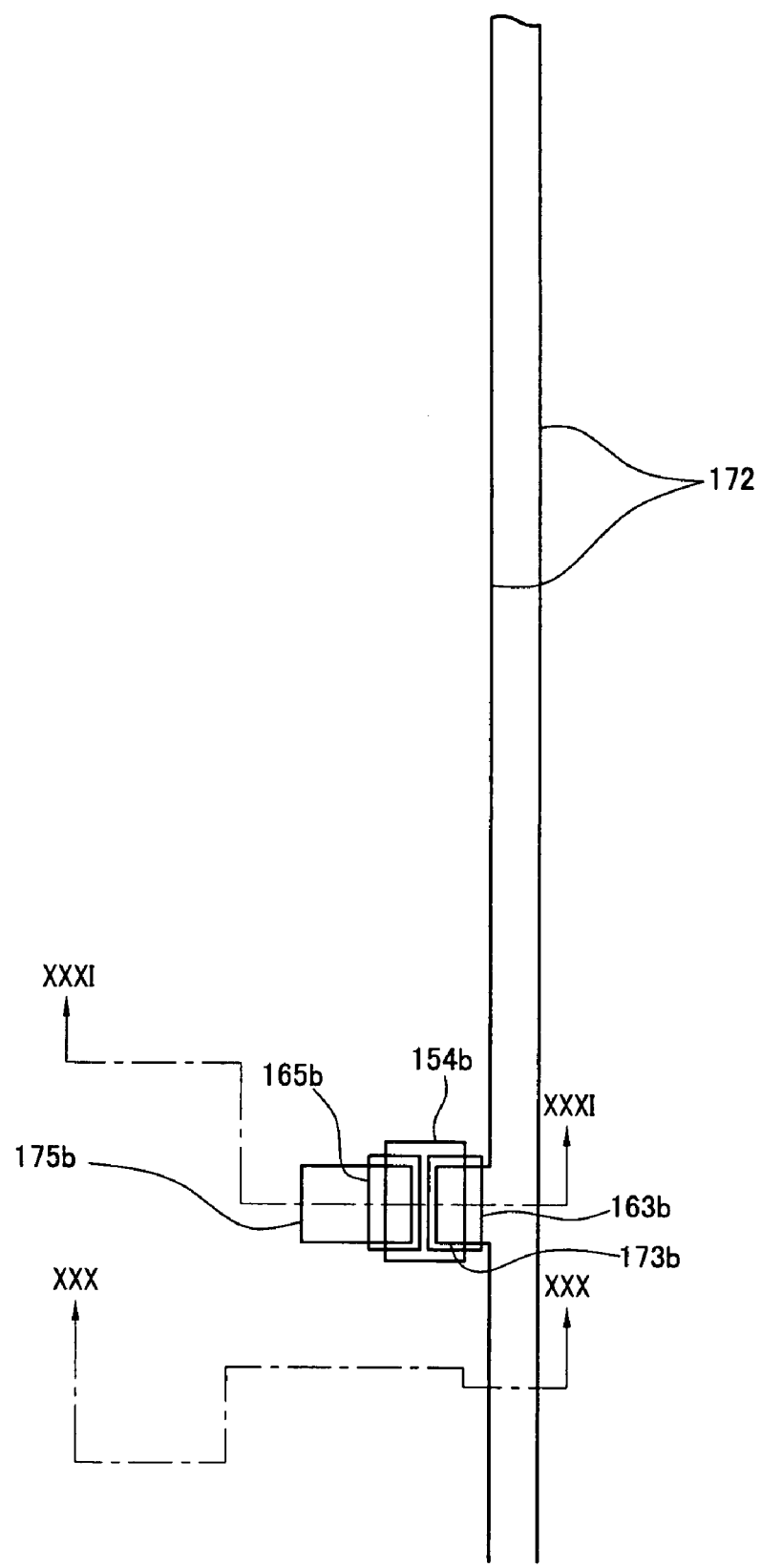
Figure 30:
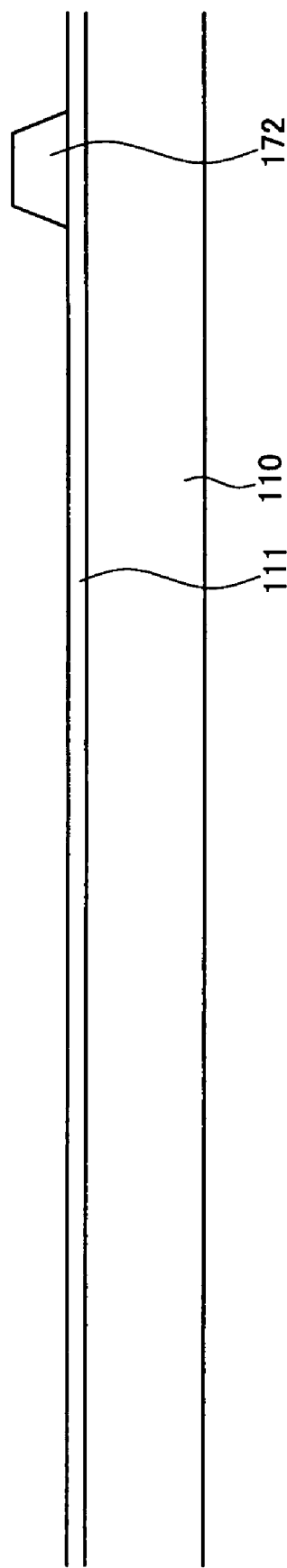
FIG. 30 is a sectional view of the organic light emitting device shown in FIG. 29 taken along the line XXX-XXX.
Figure 31:
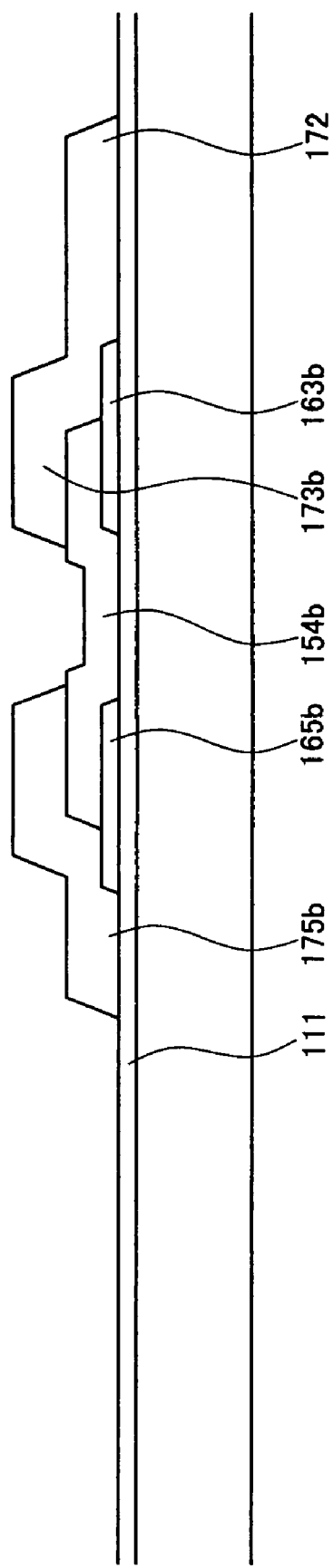
FIG. 31 is a sectional view of the organic light emitting device shown in FIG. 29 taken along the line XXXI-XXXI.
Figure 32:
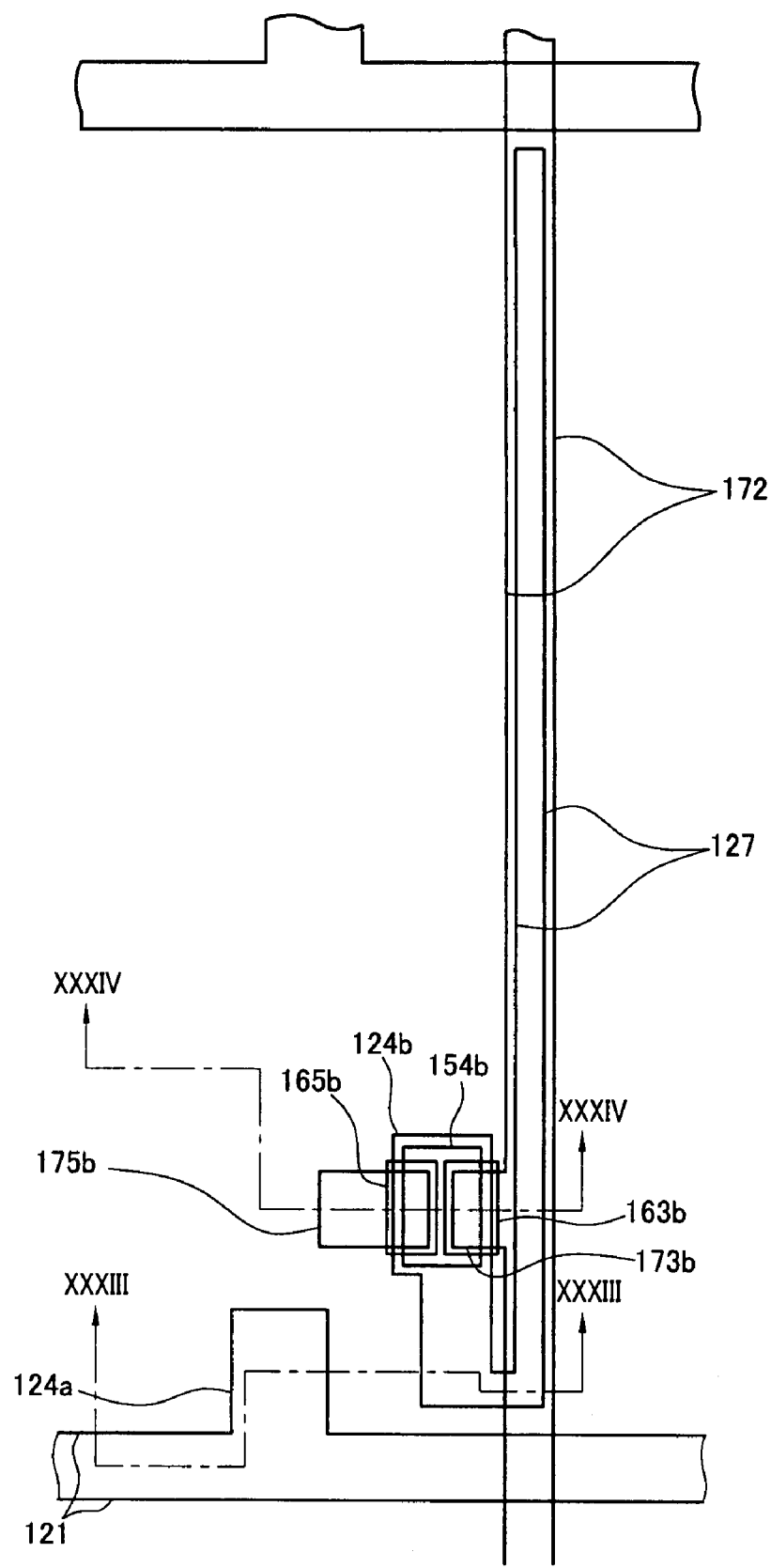
Figure 33:
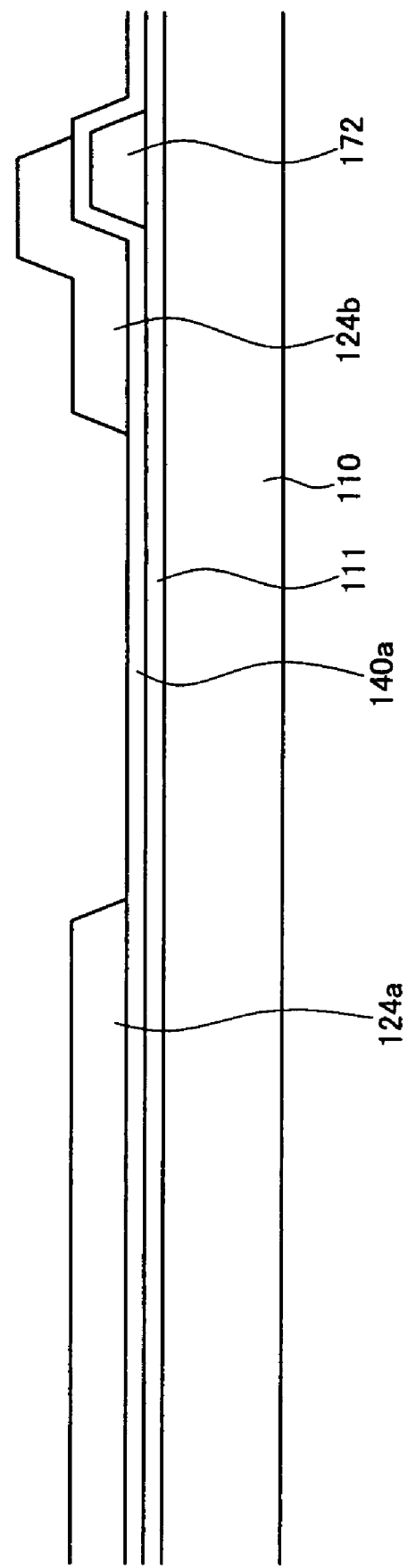
FIG. 33 is a sectional view of the organic light emitting device shown in FIG. 32 taken along the line XXXIII-XXXIII.
Figure 34:
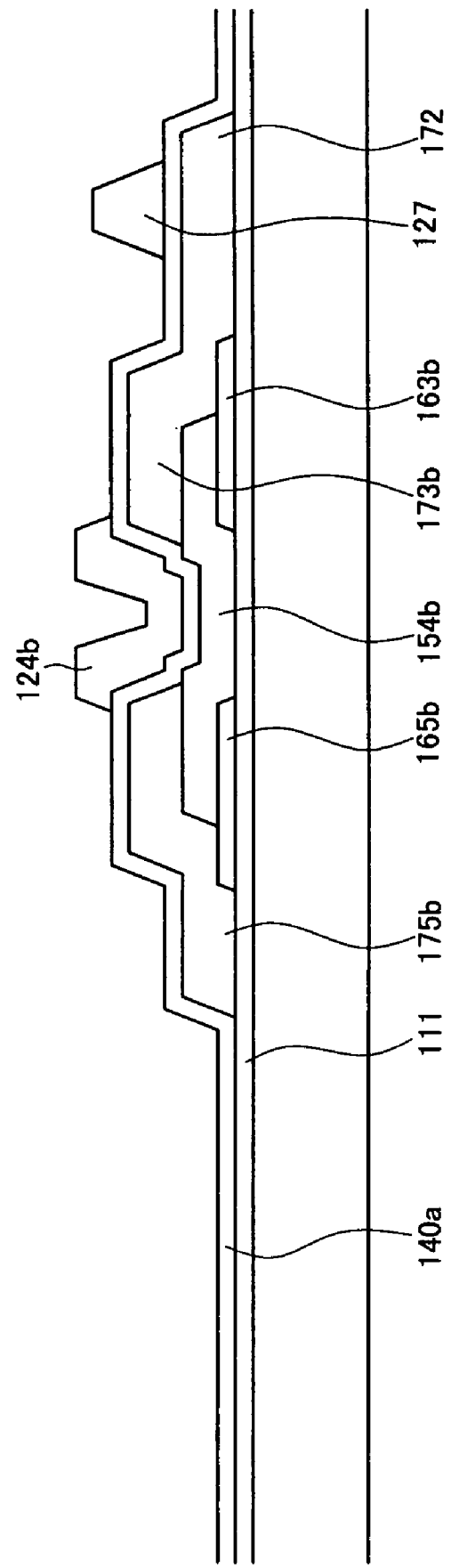
FIG. 34 is a sectional view of the organic light emitting device shown in FIG. 32 taken along the line XXXIV-XXXIV.
Figure 35:
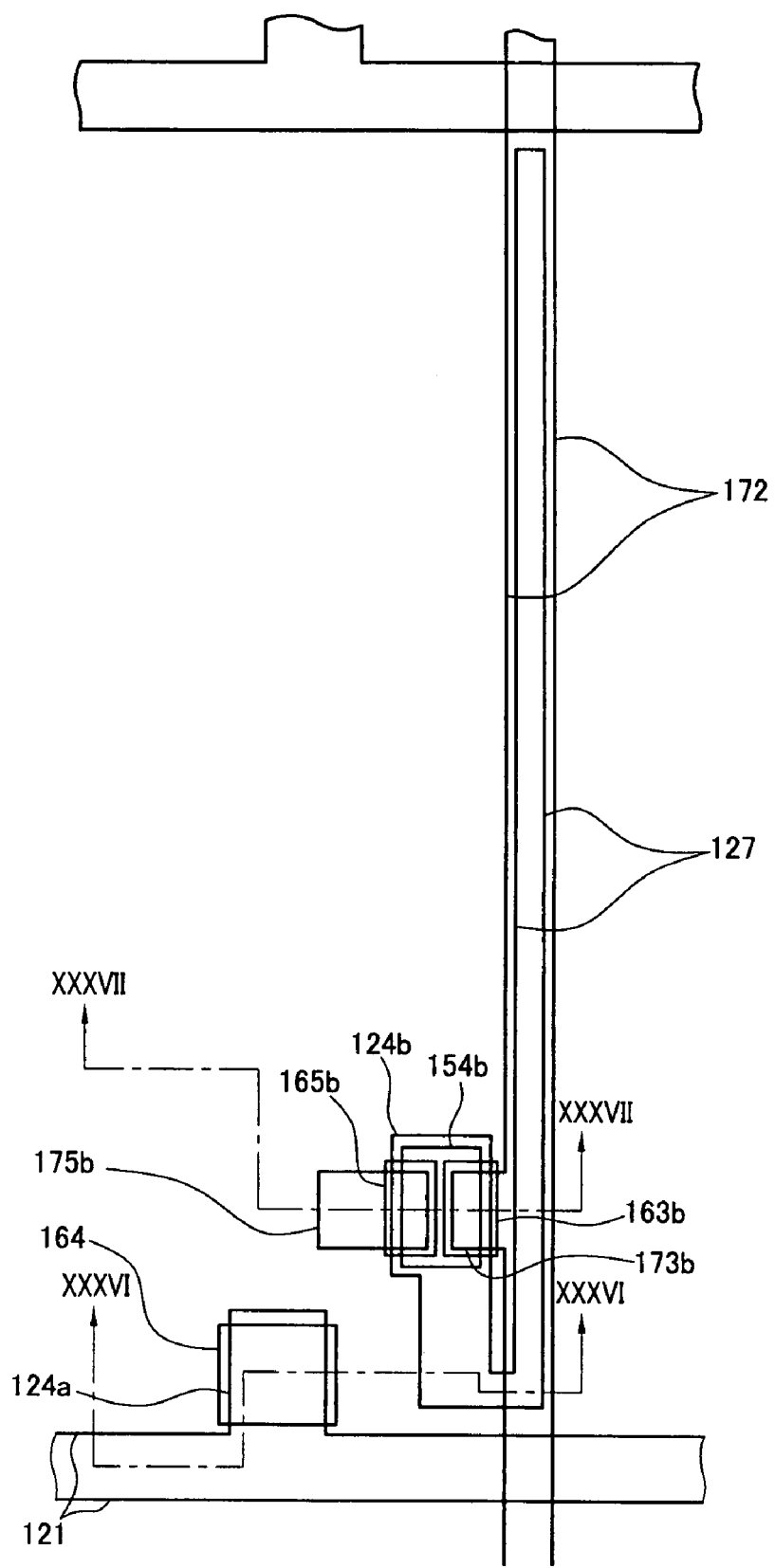
Figure 36:
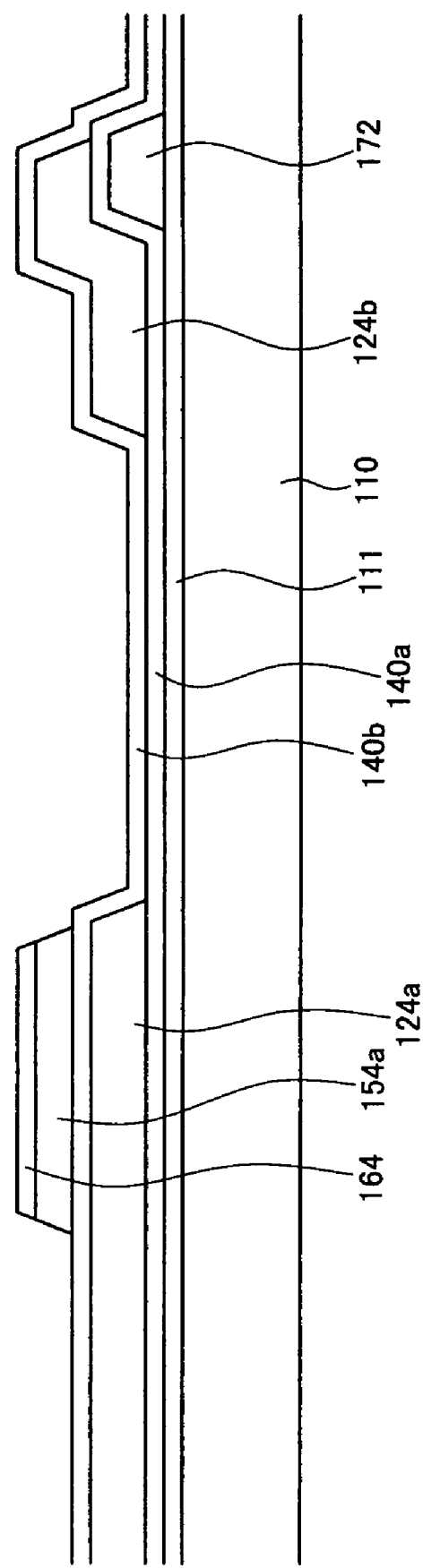
FIG. 36 is a sectional view of the organic light emitting device shown in FIG. 35 taken along the line XXXVI-XXXVI.
Figure 37:
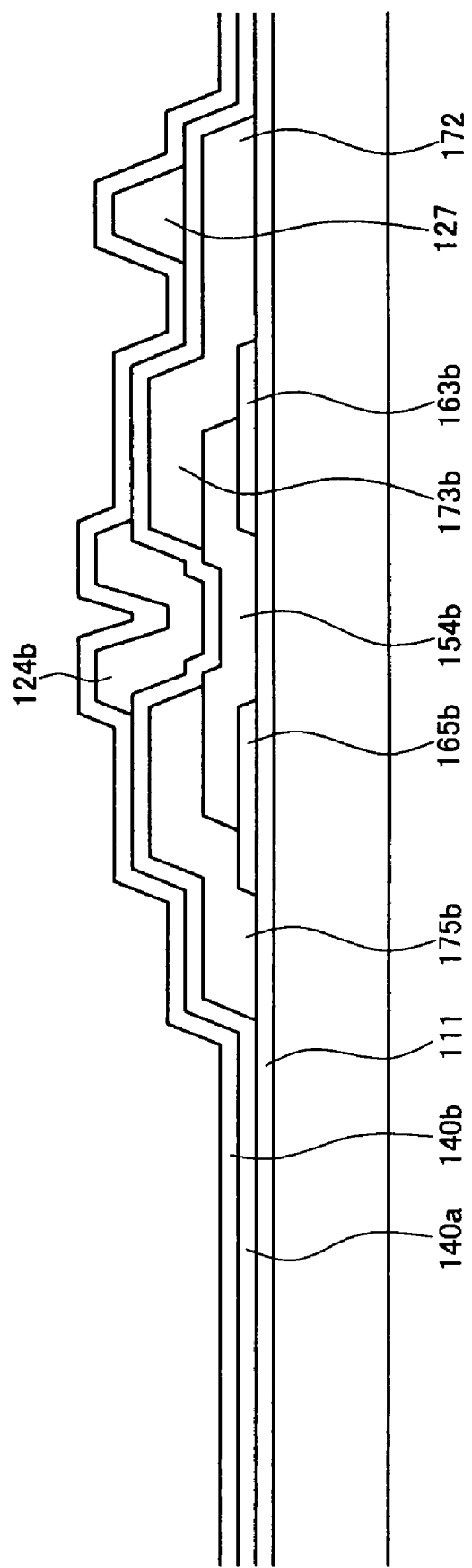
FIG. 37 is a sectional view of the organic light emitting device shown in FIG. 35 taken along the line XXXVII-XXXVII.
Figure 38:
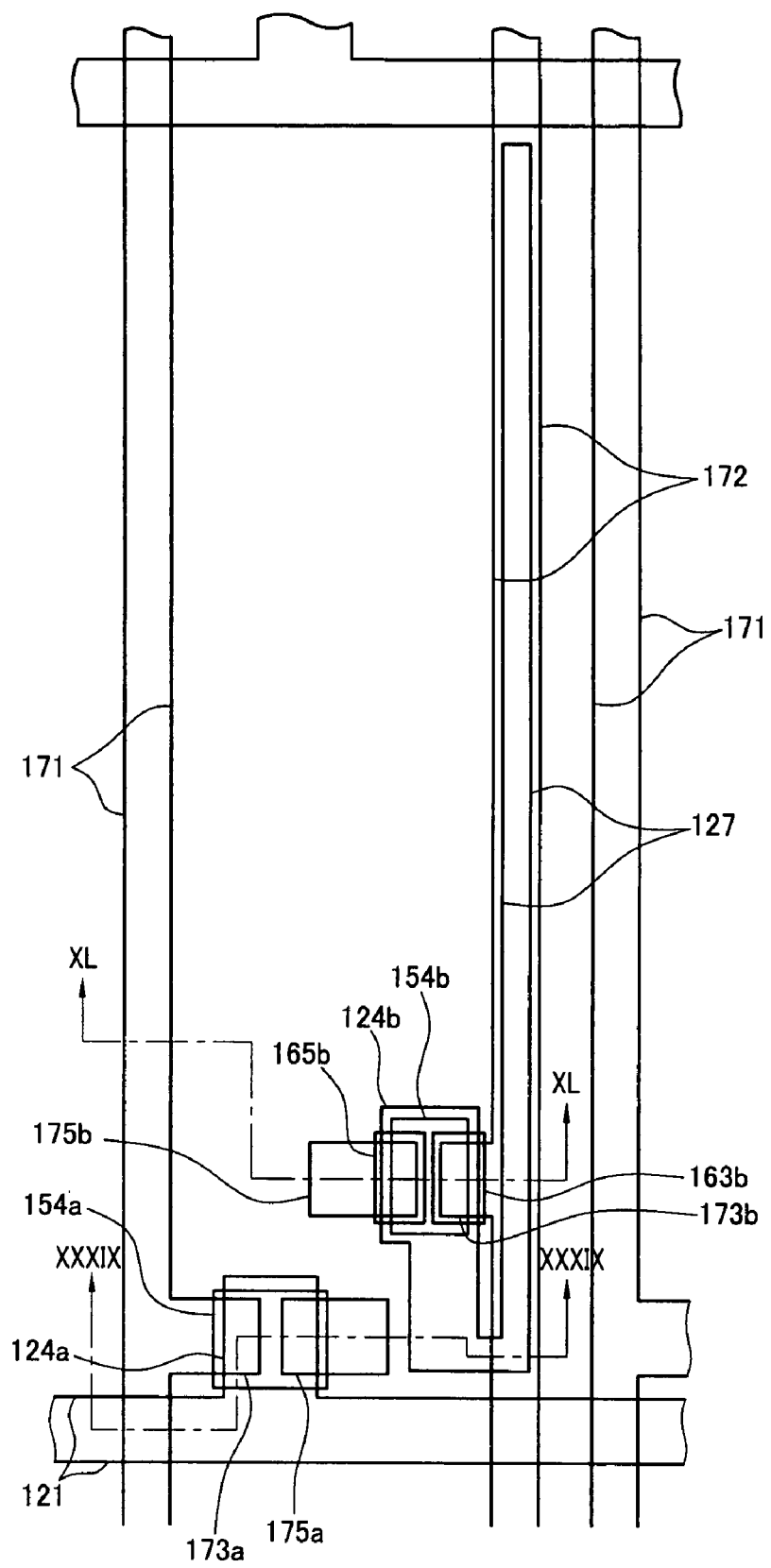
Figure 39:
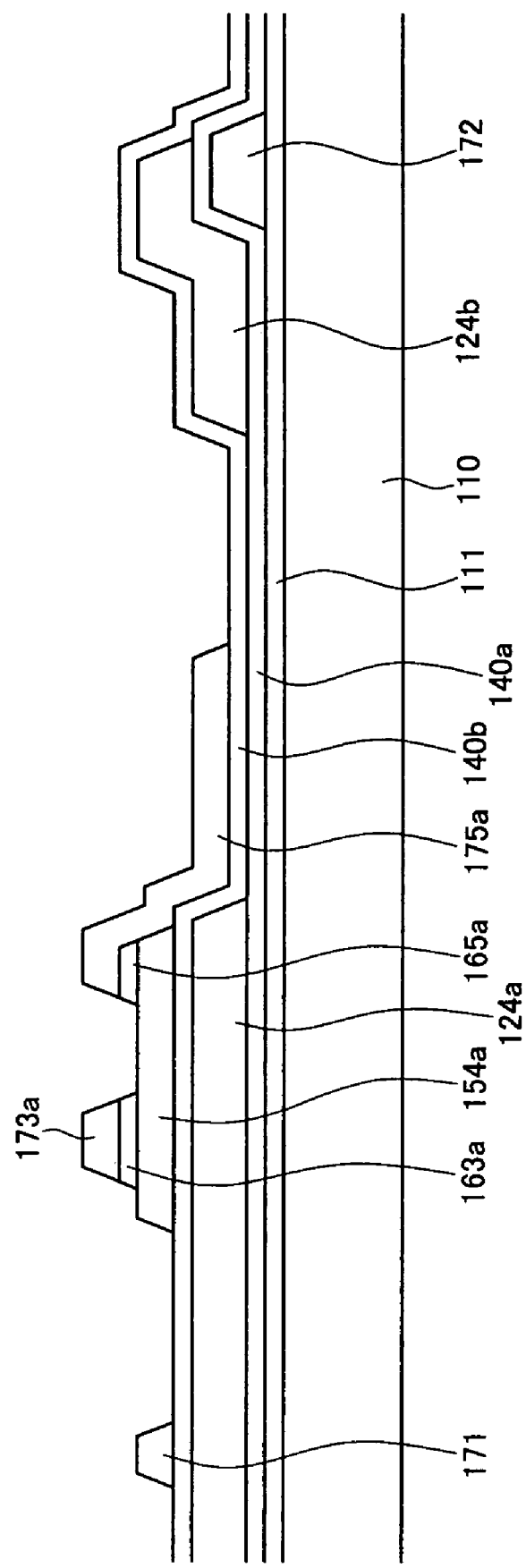
FIG. 39 is a sectional view of the organic light emitting device shown in FIG. 38 taken along the line XXXIX-XXXIX.
Figure 40:
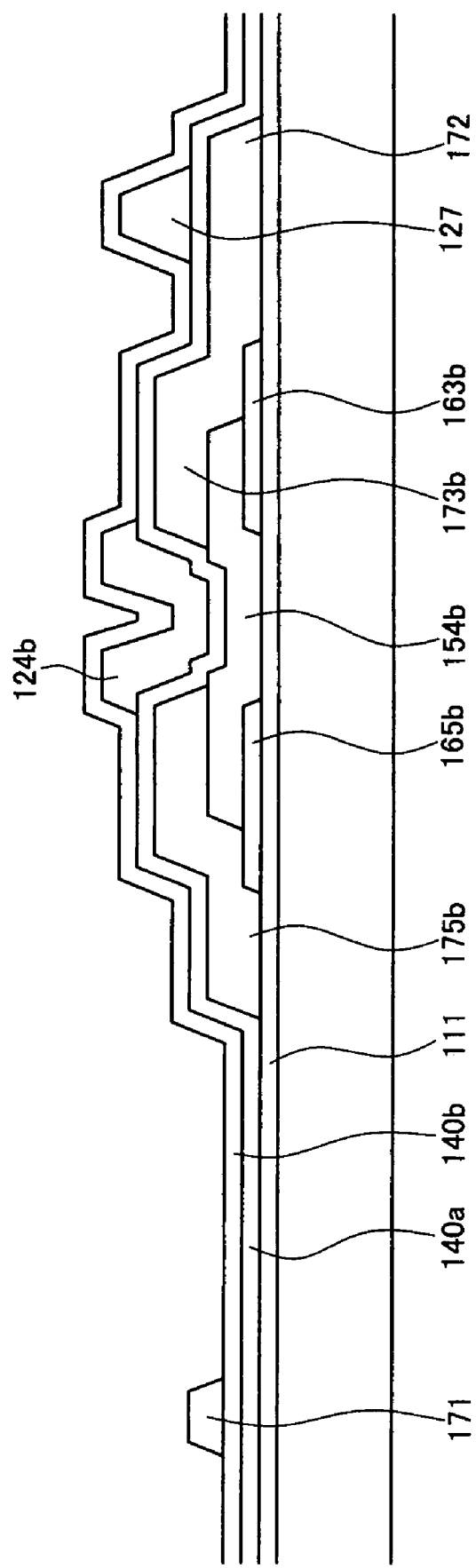
FIG. 40 is a sectional view of the organic light emitting device shown in FIG. 38 taken along the line XL-XL.
Figure 41:
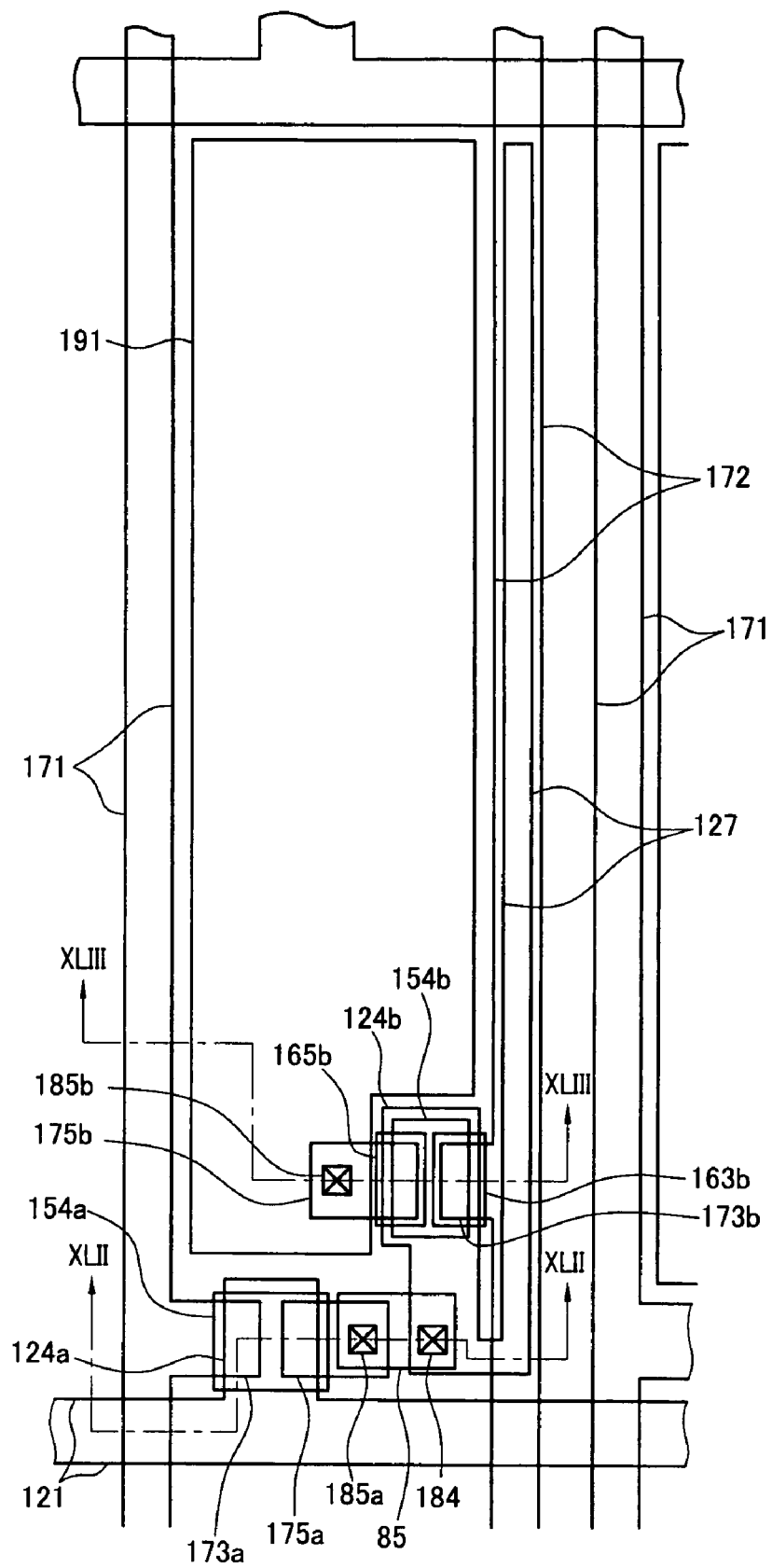
Figure 42:
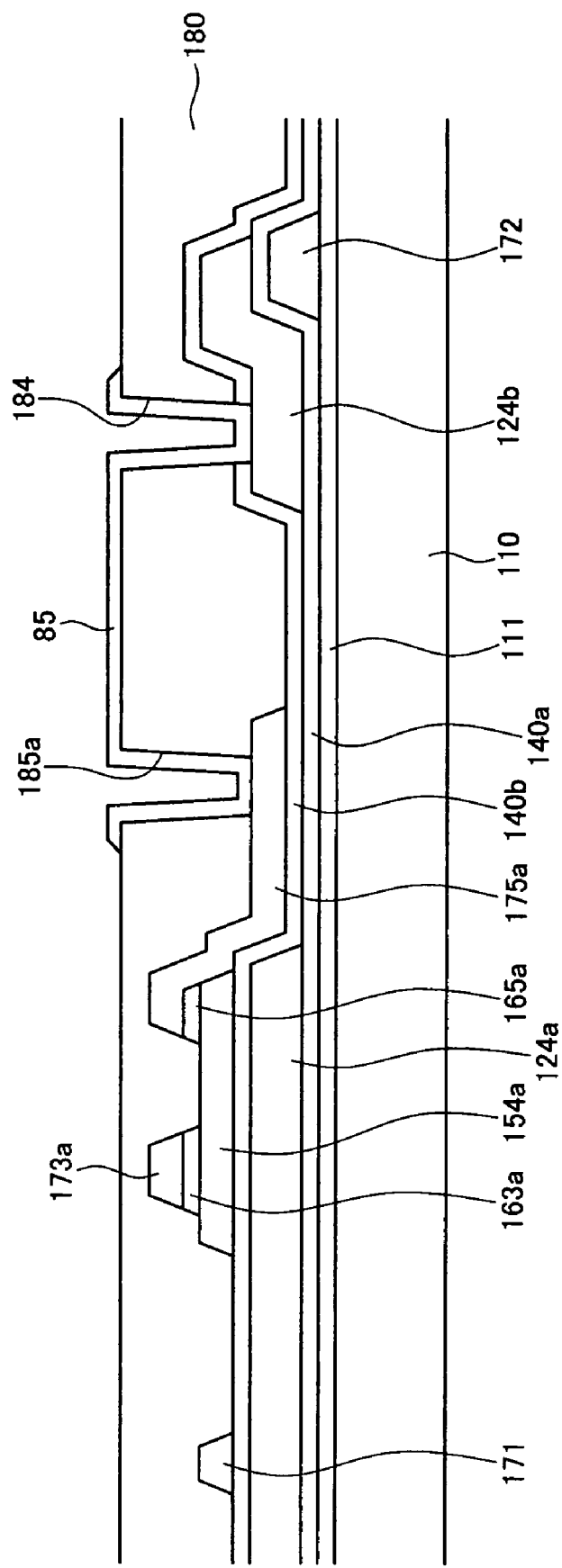
FIG. 42 is a sectional view of the organic light emitting device shown in FIG. 41 taken along the line XLII-XLII.

FIGS. 23, 26, 29, 32, 35, 38, and 41 are views of the organic light emitting device shown in FIGS. 20-22 in intermediate steps of a manufacturing method thereof according to an embodiment of the present invention, FIG. 24 is a sectional view of the organic light emitting device shown in FIG. 23 taken along the line XXIV-XXIV, FIG. 25 is a sectional view of the organic light emitting device shown in FIG. 23 taken along the line XXV-XXV, FIG. 27 is a sectional view of the organic light emitting device shown in FIG. 25 taken along the line XXVII-XXVII, FIG. 28 is a sectional view of the organic light emitting device shown in FIG. 25 taken along the line XXVIII-XXVIII, FIG. 30 is a sectional view of the organic light emitting device shown in FIG. 29 taken along the line XXX-XXX, FIG. 31 is a sectional view of the organic light emitting device shown in FIG. 29 taken along the line XXXI-XXXI, FIG. 33 is a sectional view of the organic light emitting device shown in FIG. 32 taken along the line XXXIII-XXXIII, FIG. 34 is a sectional view of the organic light emitting device shown in FIG. 32 taken along the line XXXIV-XXXIV, FIG. 36 is a sectional view of the organic light emitting device shown in FIG. 35 taken along the line XXXVI-XXXVI, FIG. 37 is a sectional view of the organic light emitting device shown in FIG. 35 taken along the line XXXVII-XXXVII, FIG. 39 is a sectional view of the organic light emitting device shown in FIG. 38 taken along the line XXXIX-XXXIX, FIG. 40 is a sectional view of the organic light emitting device shown in FIG. 38 taken along the line XL-XL, and FIG. 42 is a sectional view of the organic light emitting device shown in FIG. 41 taken along the line XLII-XLII.

A insulating layer 111 is formed on a substrate 110 by depositing an insulator such as silicon oxide as shown in FIG. 23 to FIG. 25. The blocking film may have a thickness of about 5,000 Å.

Then, a first amorphous silicon layer doped with an impurity is deposited on the insulating layer 111 by chemical vapor deposition (CVD) etc., and then the deposited first amorphous silicon layer is patterned to form a plurality of driving ohmic contacts 163b and 165b. The first amorphous silicon may have a thickness of about 300 to 500 Å.

A second amorphous silicon is deposited on the driving ohmic contacts 163b and 165b by chemical vapor deposition (CVD), and then the deposited second amorphous silicon is patterned to form a plurality of driving semiconductors 154b as shown in FIG. 26 to FIG. 28.

Thereafter, the driving semiconductors 154b are subjected to heat treatment to be crystallized. Meanwhile, polysilicon having a drain size of about 10 E-6 m may be referred to as 'microcrystalline silicon'.

The crystallization may be performed by SPC, ELA, MILC, etc. as described above with reference to FIG. 8 to FIG. 10. Here, the driving ohmic contacts 163b and 165b may be crystallized concurrently.

Next, a metal layer is formed on the substrate 110 and is patterned to form a plurality of driving voltage lines 172 including switching input electrodes 173b, and a plurality of driving output electrode 175b as shown in FIG. 29 to FIG. 31.

Referring to FIG. 32 to FIG. 34, a first gate insulating layer 140a made of silicon oxide or silicon nitride is formed on the substrate 110, and then a metal layer is deposited on the first gate insulating layer 140a by sputtering, etc., and the deposited metal layer is patterned to form a plurality of gate conductors 121 and 124b including a plurality of gate lines 121 including switching control electrodes 124a and a plurality of driving control electrodes 124b including storage electrodes 127 are formed on the first gate insulating layer 140a.

A second gate insulating layer 140b made of silicon nitride or silicon oxide is formed on the gate conductors 121 and 124b as shown in FIG. 35 to FIG. 37.

Thereafter, an intrinsic amorphous silicon layer and an extrinsic amorphous silicon layer are deposited on the second gate insulating layer 140a and are patterned to form a plurality of ohmic contact patterns 164 and a plurality of switching semiconductors 154a.

Next, a metal layer is deposited on the ohmic contact patterns 164 and is patterned to form a plurality of data lines 171 and a plurality of switching output electrodes 175a as shown in FIG. 38 to FIG. 40.

Thereafter, exposed portions of the ohmic contact patterns 164, which are not covered with the data lines 171 and the switching output electrodes 175a, are removed to complete a plurality of switching ohmic contacts 163a and 165a and to expose portions of switching semiconductors 154a.

Figure 43:
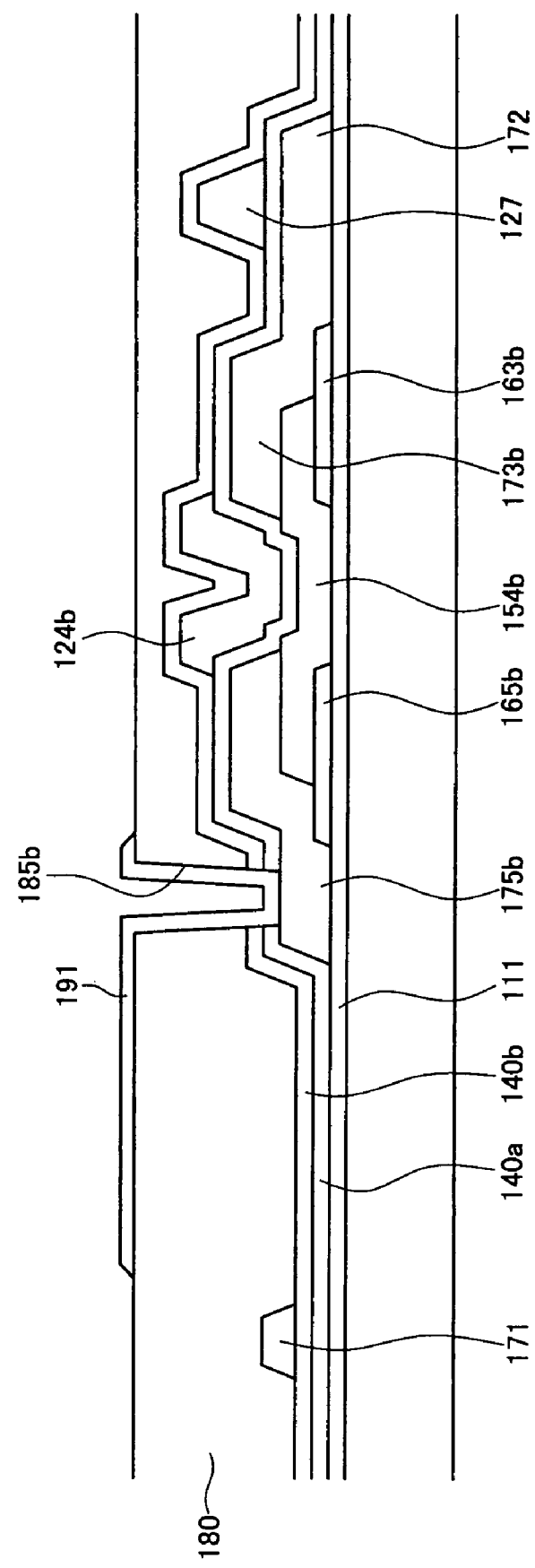
FIG. 43 is a sectional view of the organic light emitting device shown in FIG. 41 taken along the line XLIII-XLIII.

Next, a passivation layer 180 is deposited and patterned along with the first and second gate insulating layers 140a and 140b to form a plurality of contact holes as shown in FIG. 41 to FIG. 43.

Then a transparent conductive layer such as ITO is deposited on the passivation layer 180 and patterned to form a plurality of pixel electrodes 191 and a plurality of connecting members 85.

Next, an organic insulating layer or inorganic insulating layer is coated, exposed, and developed to form a partition 361 having a plurality of openings 365 on the pixel electrodes 191 as shown in FIG. 20 to FIG. 22.

A plurality of light emitting members 370 are formed in the openings 365, and a common electrode 270 is formed on the partition 361 and the light emitting members 370.

As described above, unlike the thin film transistor of the known organic light emitting device including ohmic contacts disposed between an intrinsic semiconductor of a channel and data conductors, the thin film transistor, particularly the driving thin film transistor of the organic light emitting device according to the embodiment of the present invention includes ohmic contacts formed before the formation of an intrinsic semiconductor such that the intrinsic semiconductor of the thin film transistor may not damaged by etching for forming the ohmic contacts.

Now, an organic light emitting device according to another embodiment of the present invention will be described with reference to FIG. 44 to FIG. 45.

Figure 44:
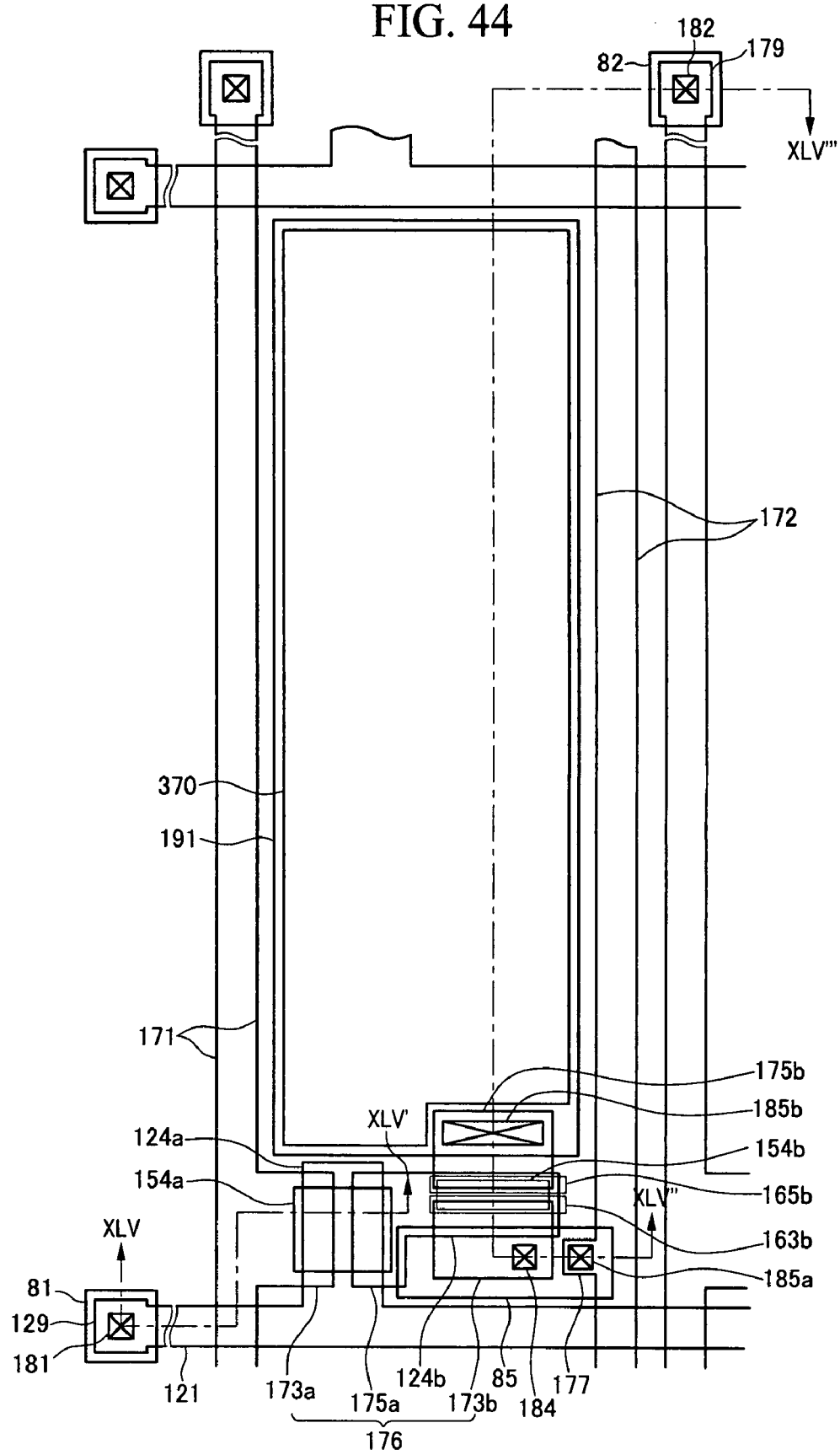
FIG. 44 is a layout view of an organic light emitting device according to a third embodiment of the present invention.
Figure 45:
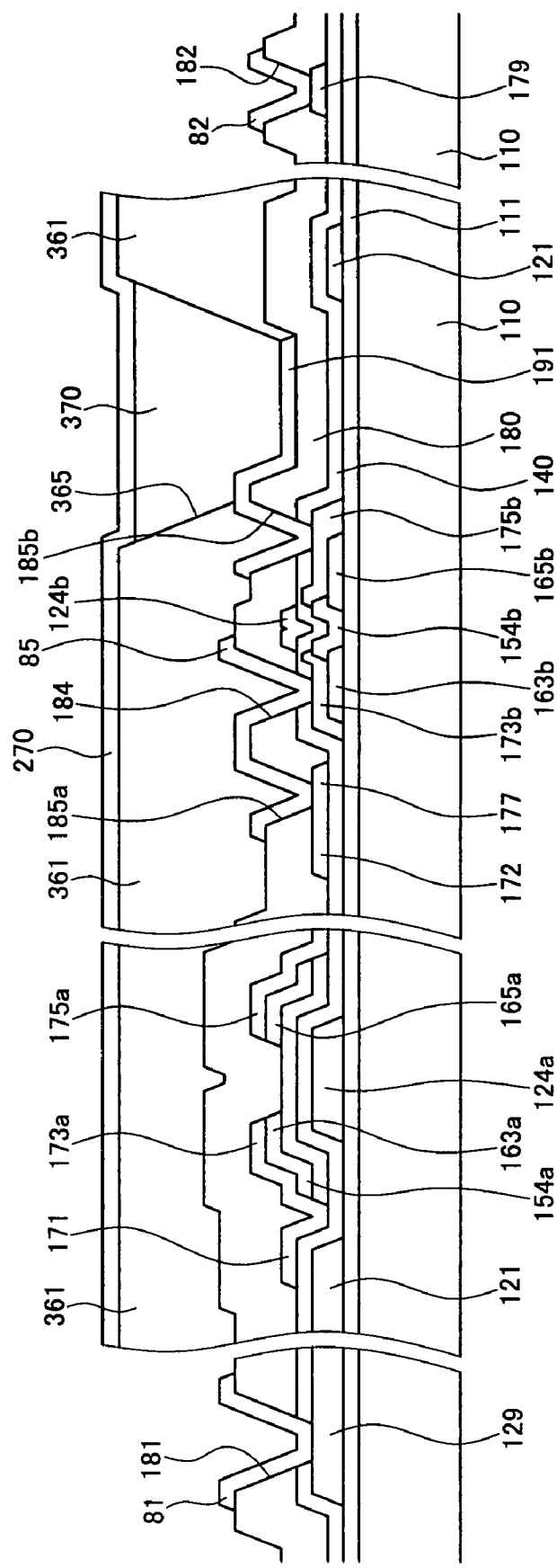
FIG. 45 is a sectional view of the organic light emitting device shown in FIG. 44 taken along the line XLIV-XLIV'-XLIV"-XLV"'.

FIG. 44 is a layout view of an organic light emitting device according to another embodiment of the present invention, and FIG. 45 is a sectional view of the organic light emitting device shown in FIG. 44 taken along the line XLIV-XLIV'-XLIV"-XLV'".

Figure 46:
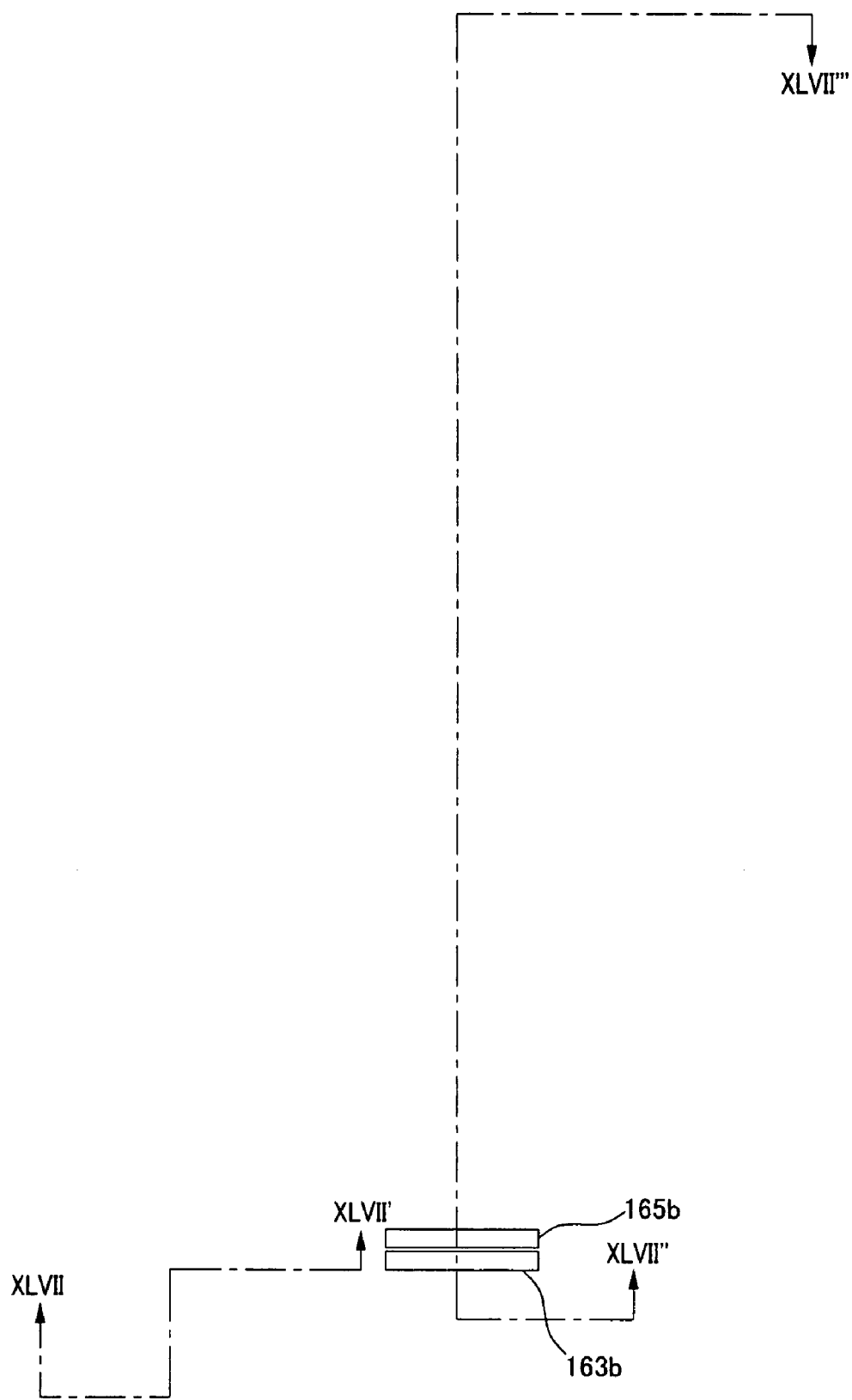
FIG. 46 is a layout view of the organic light emitting device in an intermediate step of a manufacturing method thereof according to another embodiment of the present invention.

As shown in FIG. 44 to FIG. 46, a layered structure of an organic light emitting device according to the present embodiment is substantially the same as those shown in FIG. 2 to FIG. 4 and FIG. 20 to FIG. 22.

A insulating layer 111 is formed on an insulating substrate 110. A plurality of pairs of driving ohmic contacts 163b and 165b are formed on the insulating layer 111. A plurality of driving semiconductors 154b are formed on the driving ohmic contacts 163b and 165b. Each driving semiconductor 154b connects the driving ohmic contacts 163b and 165b to each other.

The driving semiconductor 154b may be made of polysilicon.

A plurality of driving output electrodes 175b, a plurality of driving input electrodes 173b, and a plurality of gate lines 121 including a plurality of driving control electrodes 124a are formed on the insulating layer 111, the driving semiconductors 154b, and the ohmic contacts 163b and 165b.

The driving input electrodes 173b and the driving output electrodes 175b are island-shaped and separated from the gate lines 121. Each driving input electrode 173b and each driving output electrode 175b are disposed opposite each other with respect to each driving semiconductor 154b.

The gate lines 121, the driving input electrodes 173b, and the driving output electrodes 175b are preferably made of an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, Ti, etc. However, they may have a multi-layered structure including two films having different physical characteristics.

A gate insulating layer 140 is formed on the gate lines 121, the driving input electrodes 173b, the driving output electrodes 175b, and insulating layer 111.

A plurality of switching semiconductors 154a made of hydrogenated amorphous silicon are formed on the gate insulating layer 140. The switching semiconductors 154a are island-shaped and overlap the switching control electrodes 124a.

A plurality of data lines 171, a plurality of driving voltage lines 172, and a plurality of electrode members 176 are formed on the switching semiconductors 154a and the gate insulating layer 140.

The data lines 171 transmit data signals and extend substantially in the longitudinal direction to intersect the gate lines 121. Each data line 171 includes a plurality of switching input electrodes 173a extending toward the switching control electrodes 124a and an end portion 179 having a large area for contact with another layer or an external driving circuit. The data lines 171 may extend to be directly connected to a data driving circuit (not shown) for generating the data signals, which may be integrated on the substrate 110.

The driving voltage lines 172 transmit driving voltages, extend substantially in the longitudinal direction to intersect the gate lines 121, and are substantially parallel to the data lines 171. Each driving voltage line 172 includes a projection 177.

The electrode members 176 are island-shaped, and separated from the data lines 171 and the driving voltage lines 172. Each electrode member 176 includes a portion 175a facing the switching input electrode 173a (referred to as "switching output electrode" hereinafter) and a portion 124b overlapping the driving semiconductor 154b (referred to as "driving control electrode" hereinafter). The switching input electrode 173a and the switching output electrode 175a are opposite each other with respect to the switching semiconductor 154a, respectively.

The data lines 171, the driving voltage lines 172, and the electrode members 176 may include the same material as the gate lines 121.

A plurality of pairs of switching ohmic contacts 163a and 165a are formed between the switching semiconductors 154a and the switching input electrodes 173a, and between the switching semiconductors 154a and the switching output electrodes 175a, respectively. A passivation layer 180 is formed on the data lines 171, the driving voltage lines 172, and the electrode members 176.

The passivation layer 180 has a plurality of contact holes 185a and 182 exposing the projections 177 of the driving voltage lines 172 and the end portions 179 of the data lines 171, respectively, and the passivation layer 180 and the gate insulating layer 140 have a plurality of contact holes 181, 184, and 185b exposing the end portions 129 of the gate lines 121, the driving input electrodes 173b, and the driving output electrodes 175b, respectively.

A plurality of pixel electrodes 191, a plurality of connecting members 85, and a plurality of contact assistants 81 and 82 are formed on the passivation layer 180.

The pixel electrodes 191 are connected to the driving output electrodes 175b through the contact holes 185b.

The connecting members 85 are connected to the projections 177 of the driving voltage lines 172 and the driving input electrodes 173b through the contact holes 184 and 185a, respectively. The connecting members 85 overlap portions of the driving control electrode 124b to form storage capacitors Cst.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance adhesion between the end portions 129 and 179 and external devices.

Now, a manufacturing method of the organic light emitting device shown in FIG. 44 and FIG. 45 is described with reference to FIG. 46 to FIG. 57 along with FIG. 44 and FIG. 45.

Figure 47:
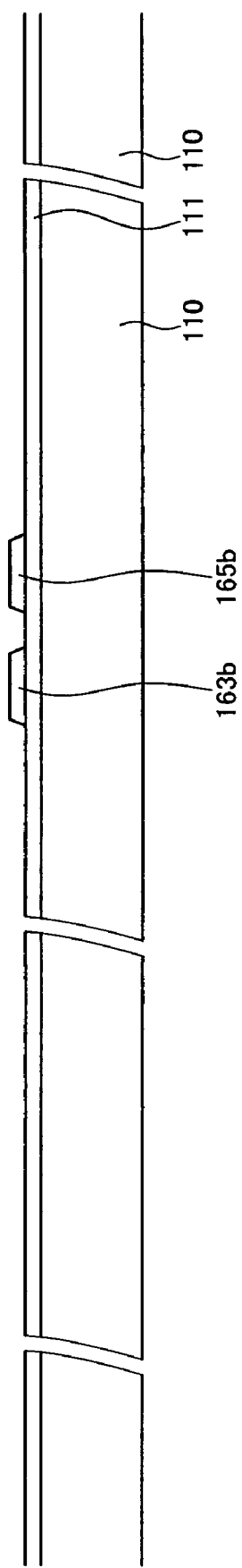
FIG. 47 is a sectional view of the organic light emitting device shown in FIG. 46 taken along the line XLVII-XLVII'-XLVII"-XLVII"'.
Figure 48:
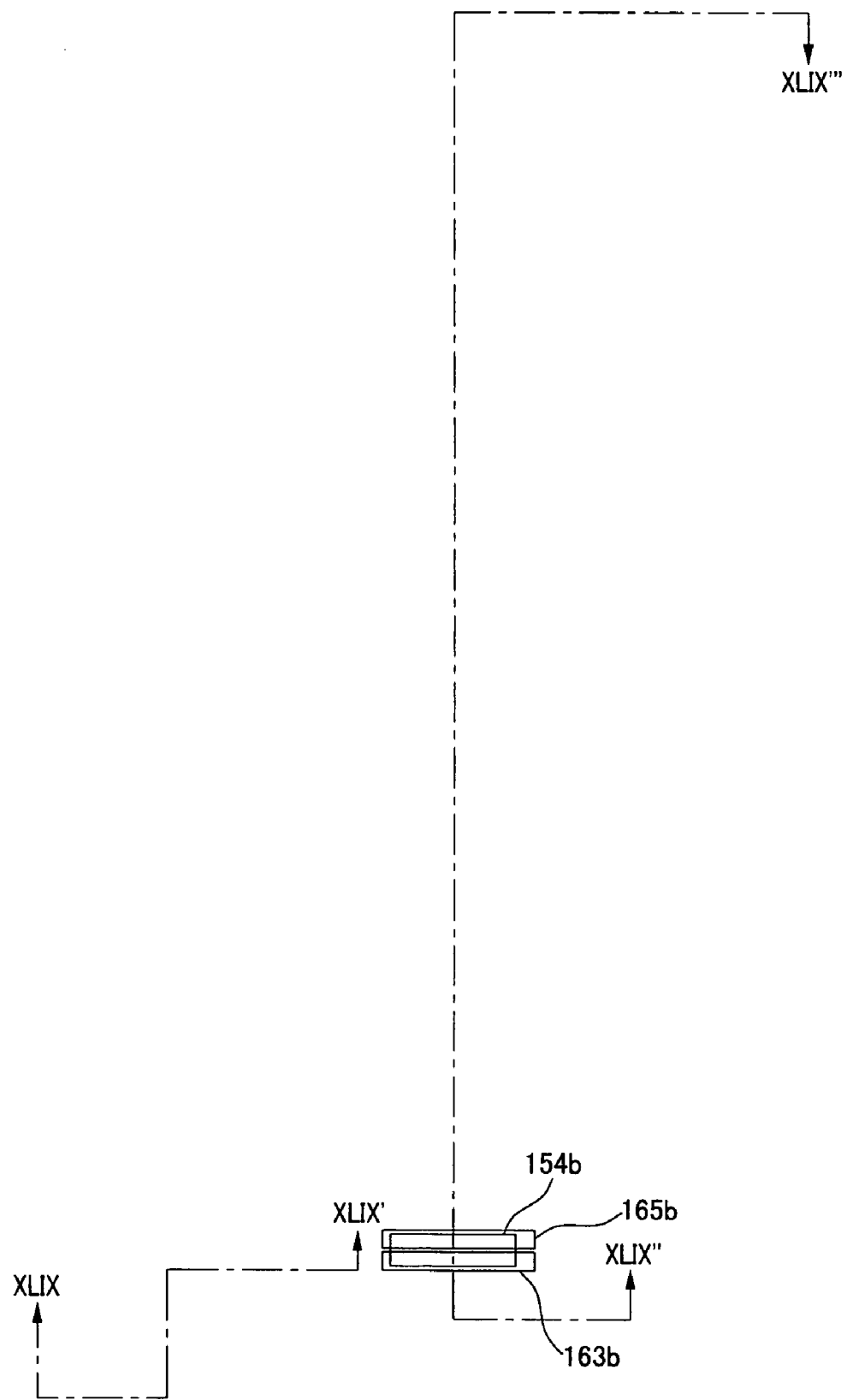
FIG. 48 is a layout view of the organic light emitting device in the next step of the manufacturing method shown in FIG. 46.
Figure 49:
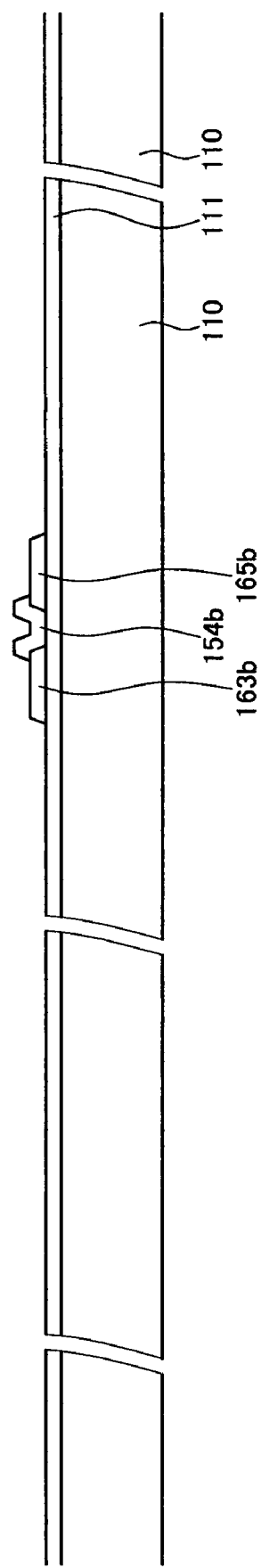
FIG. 49 is a sectional view of the organic light emitting device shown in FIG. 48 taken along the line XLIX-XLIX'-XLIX"-XLX"'.
Figure 50:
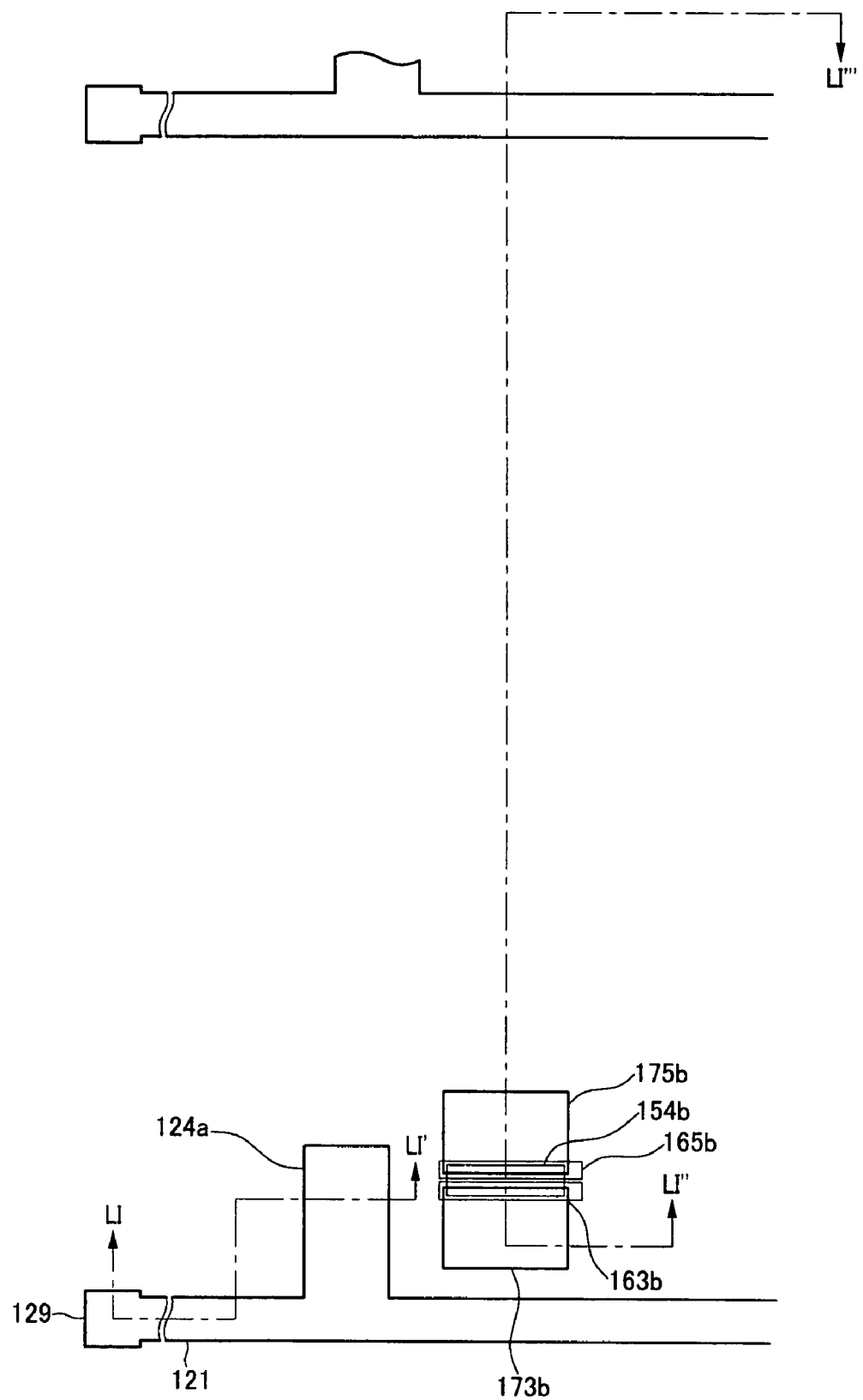
FIG. 50 is a layout view of the organic light emitting device in the next step of the manufacturing method shown in FIG. 48.
Figure 51:
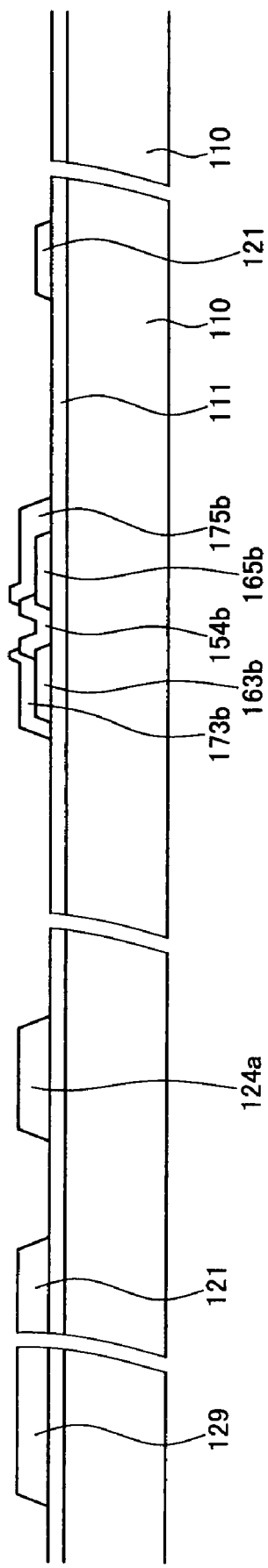
FIG. 51 is a sectional view of the organic light emitting device shown in FIG. 50 taken along the line LI-LI'-LI"-LI"'.
Figure 52:
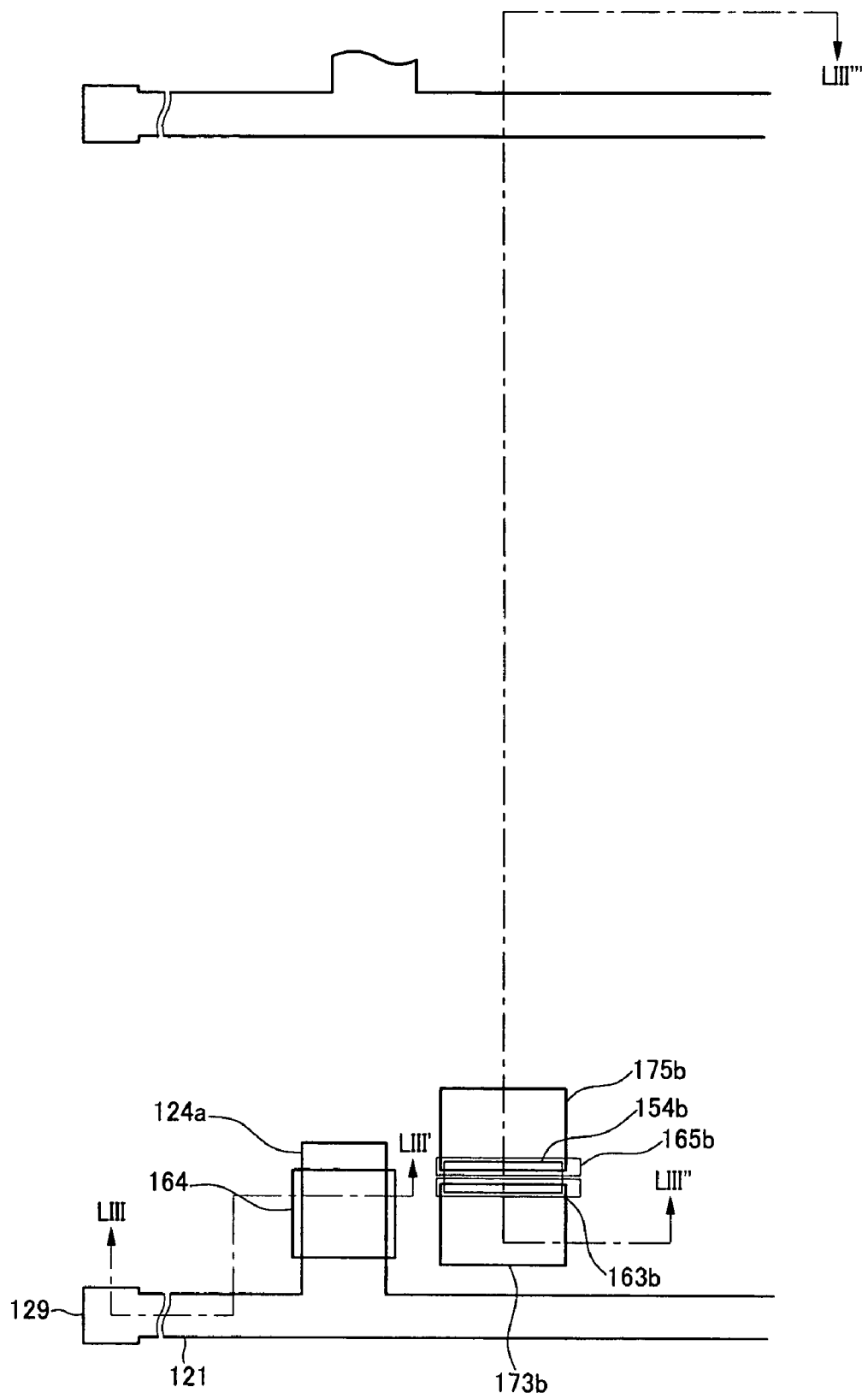
FIG. 52 is a layout view of the organic light emitting device in the next step of the manufacturing method shown in FIG. 50.
Figure 53:
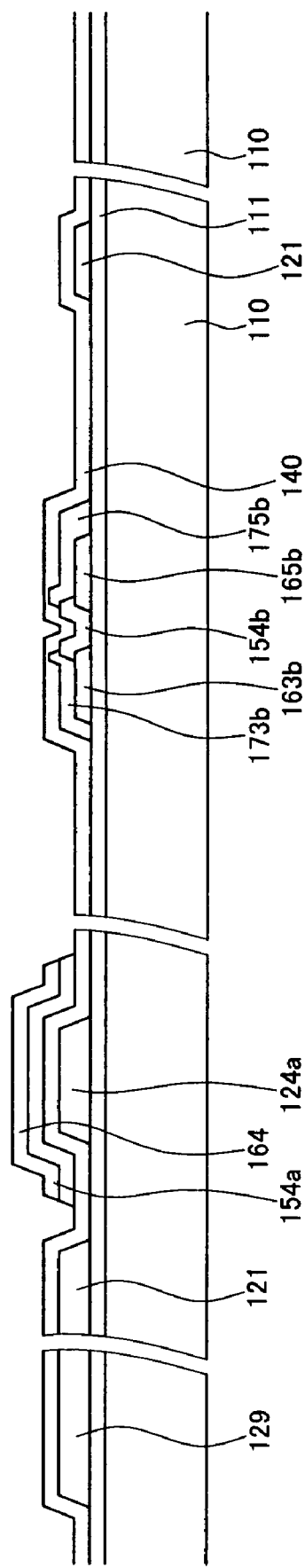
FIG. 53 is a sectional view of the organic light emitting device shown in FIG. 52 taken along the line LIII-LIII'-LIII"-LIII"'.
Figure 54:
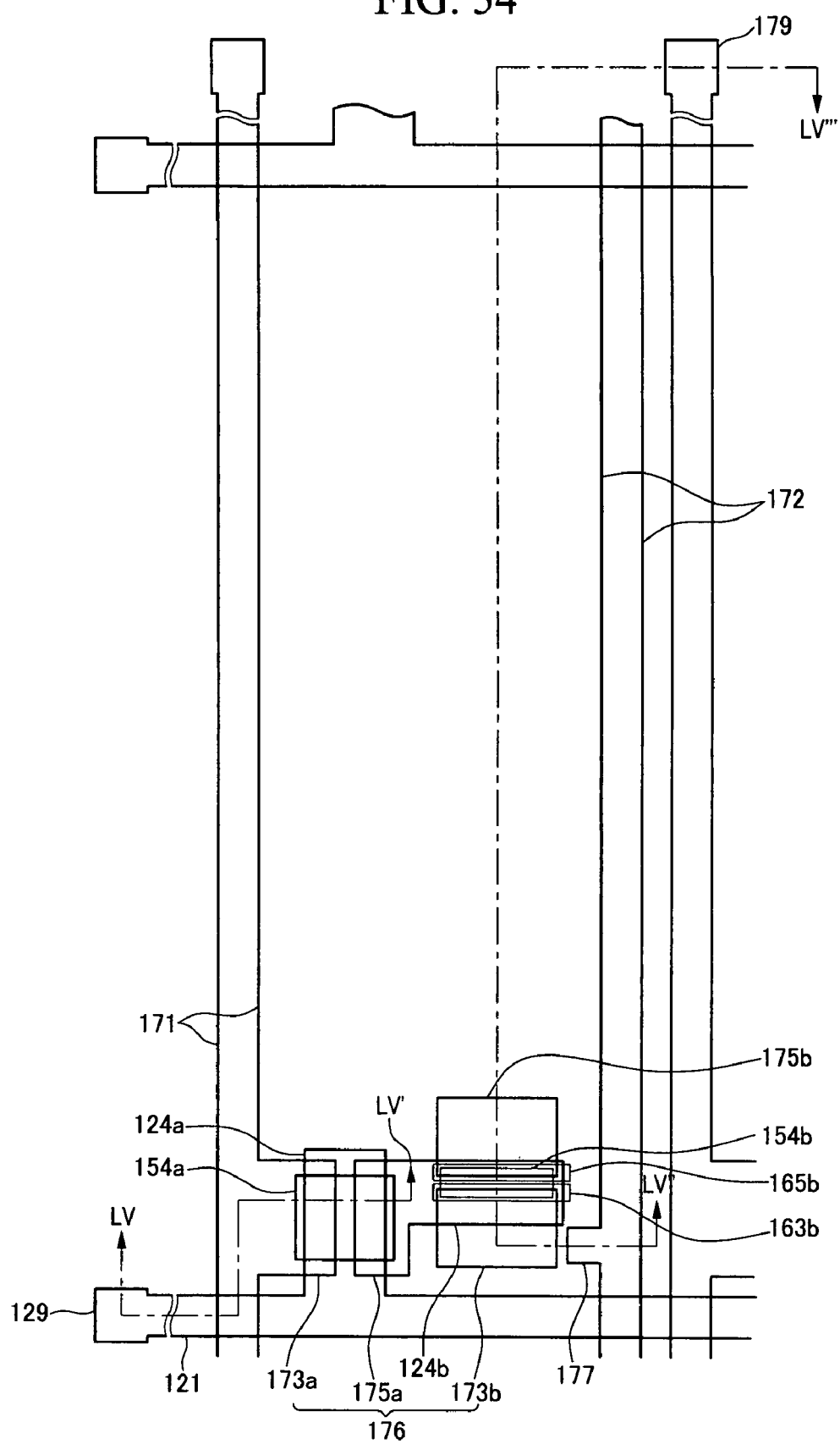
FIG. 54 is a layout view of the organic light emitting device in the next step of the manufacturing method shown in FIG. 52.
Figure 55:
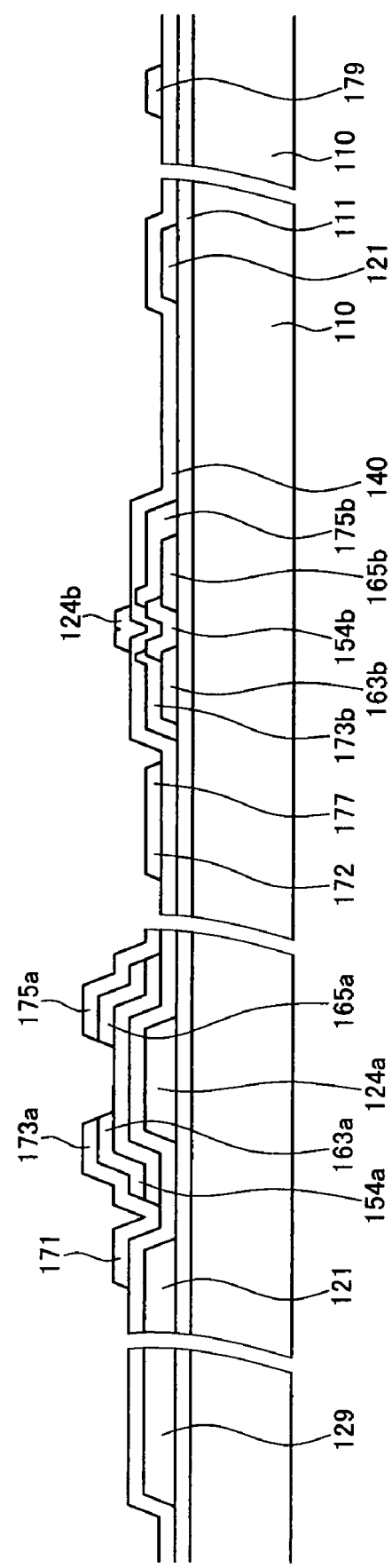
FIG. 55 is a sectional view of the organic light emitting device shown in FIG. 54 taken along the line LV-LV'-LV"-LV"'.
Figure 56:
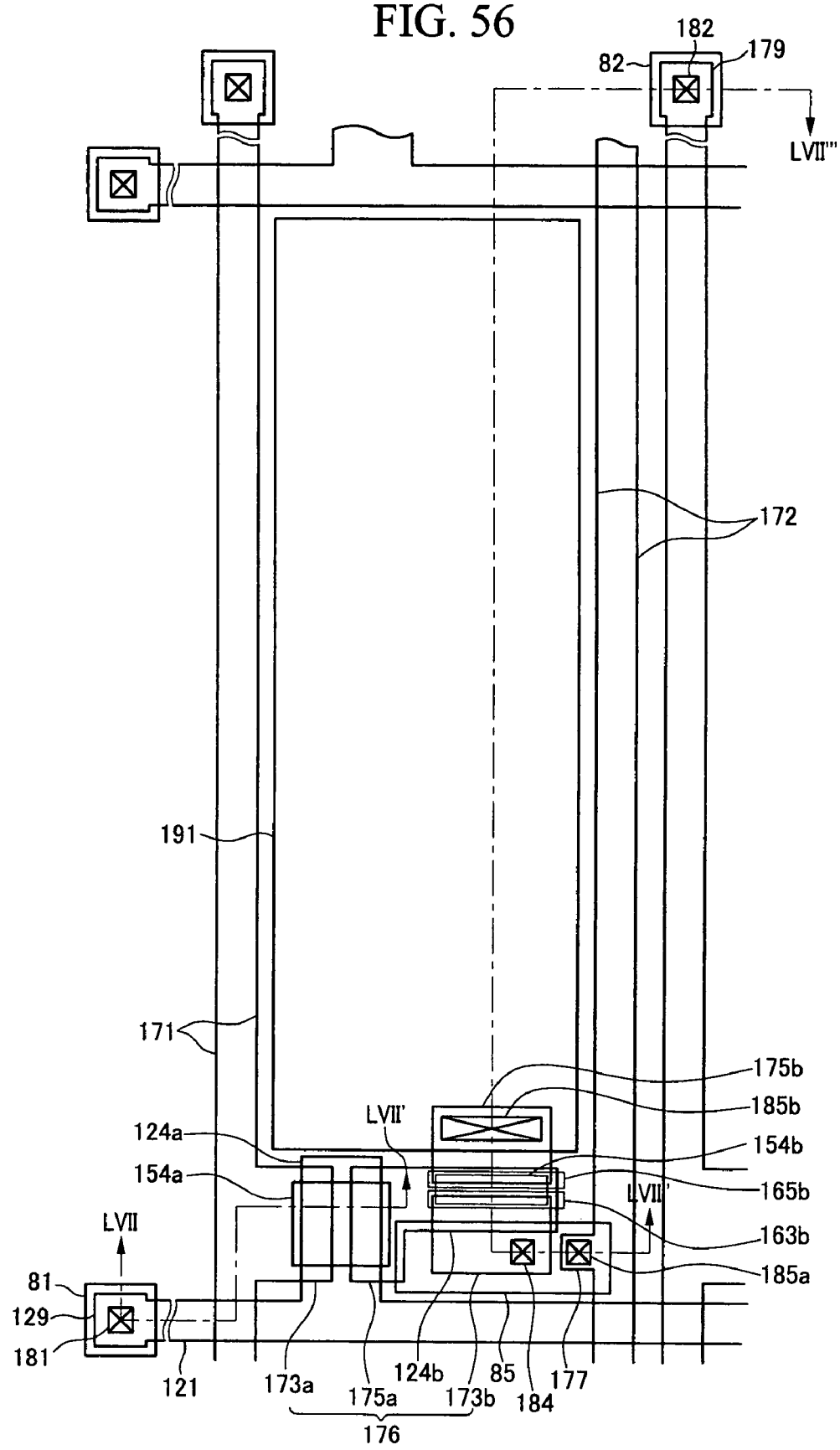
FIG. 56 is a layout view of the organic light emitting device in the next step of the manufacturing method shown in FIG. 54.
Figure 57:
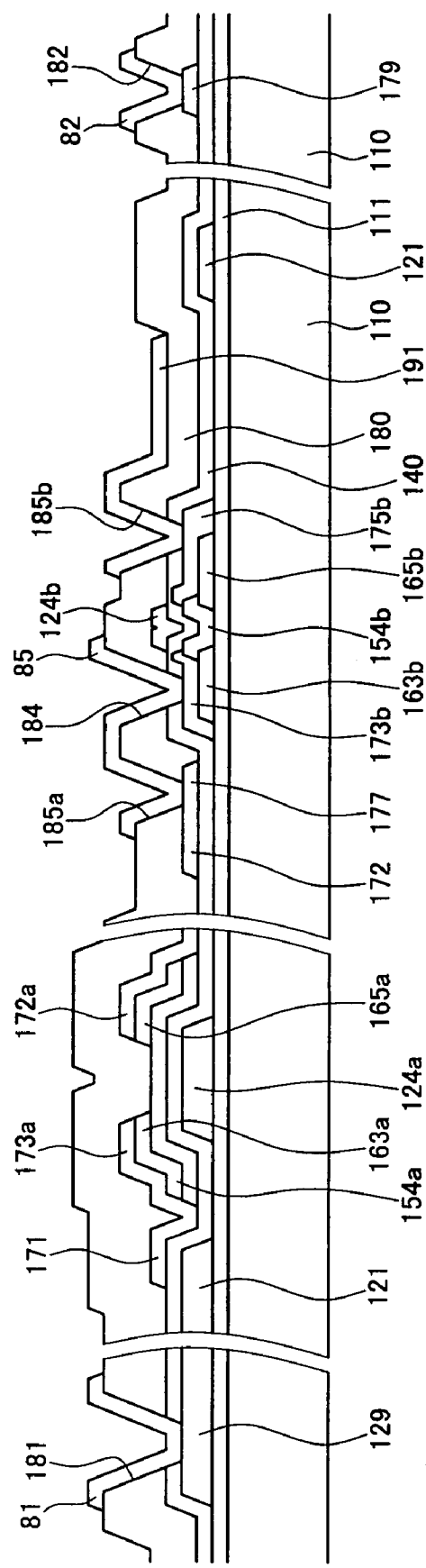
FIG. 57 is a sectional view of the organic light emitting device shown in FIG. 56 taken along the line LVII-LVII'-LVII"-LVII"'.

FIG. 46 is a layout view of the organic light emitting device in intermediate step of a manufacturing method thereof according to another embodiment of the present invention, FIG. 47 is a sectional view of the organic light emitting device shown in FIG. 46 taken along the line XLVII-XLVII'-XLVII''-XLVII''', FIG. 48 is a layout view of the organic light emitting device in the next step of the manufacturing method shown in FIG. 46, FIG. 49 is a sectional view of the organic light emitting device shown in FIG. 48 taken along the line XLIX-XLIX'-XLIX''-XLX''', FIG. 50 is a layout view of the organic light emitting device in the next step of the manufacturing method shown in FIG. 48, FIG. 51 is a sectional view of the organic light emitting device shown in FIG. 50 taken along the line LI-LI'-LI''-LI''', FIG. 52 is a layout view of the organic light emitting device in the next step of the manufacturing method shown in FIG. 50, FIG. 53 is a sectional view of the organic light emitting device shown in FIG. 52 taken along the line LIII-LIII'-LIII''-LIII''', FIG. 54 is a layout view of the organic light emitting device in the next step of the manufacturing method shown in FIG. 52, FIG. 55 is a sectional view of the organic light emitting device shown in FIG. 54 taken along the line LV-LV'-LV''-LV''', FIG. 56 is a layout view of the organic light emitting device in the next step of the manufacturing method shown in FIG. 54, and FIG. 57 is a sectional view of the organic light emitting device shown in FIG. 56 taken along the line LVII-LVII'-LVII''-LVII'''.

A insulating layer 111 is formed on a substrate 110 by depositing an insulator such as silicon oxide as shown in FIG. 46 and FIG. 47. The blocking film may have a thickness of about 5,000 Å.

Then, a first amorphous silicon layer doped with an impurity is deposited on the insulating layer 111 by chemical vapor deposition (CVD) etc., and then the deposited first amorphous silicon layer is patterned to form a plurality of driving ohmic contacts 163b and 165b. The first amorphous silicon may have a thickness of about 300 to 500 Å.

A second amorphous silicon is deposited on the driving ohmic contacts 163b and 165b by chemical vapor deposition (CVD), and then the deposited second amorphous silicon is patterned to form a plurality of driving semiconductors 154b as shown in FIGS. 48 and 49.

Thereafter, the driving semiconductors 154b are subjected to heat treatment to be crystallized. Meanwhile, polysilicon having a drain size of about 10 E-6 m may be referred to as 'microcrystalline silicon'.

The crystallization may be performed by SPC, ELA, MILC, etc. as described above with reference to FIG. 8 to FIG. 10. Here, the driving ohmic contacts 163b and 165b may be crystallized concurrently.

Next, a metal layer is formed on the substrate 110 and is patterned to form a plurality of driving output electrodes 175b, a plurality of driving input electrodes 173b, and a plurality of gate lines 121 including a plurality of driving control electrodes 124b as shown in FIG. 50 and FIG. 51.

A gate insulating layer 140 is formed on the substrate 110 as shown in FIG. 52 and FIG. 53.

Thereafter, an intrinsic amorphous silicon layer and an extrinsic amorphous silicon layer are deposited on the gate insulating layer 140 and are patterned to form a plurality of ohmic contact patterns 164 and a plurality of switching semiconductors 154a.

Next, a metal layer is deposited on the ohmic contact patterns 164 and is patterned to form a plurality of data lines 171, a plurality of driving voltage lines 172 including switching input electrodes 175a, and a plurality of electrode members 176 as shown in FIG. 54 and FIG. 55.

Thereafter, exposed portions of the ohmic contact patterns 164, which are not covered with the data lines 171, the driving voltage lines 172, and the electrode members 176, are removed to complete a plurality of switching ohmic contacts 163a and 165a and to expose portions of switching semiconductors 154a.

Next, a passivation layer 180 is deposited and patterned along with the gate insulating layer 140 to form a plurality of contact holes 184, 185a, and 185b as shown in FIG. 56 and FIG. 57.

Then, a conductive layer is deposited on the passivation layer 180 and patterned to form a plurality of pixel electrodes 191 and a plurality of connecting members 85.

A partition 361 made of an insulator and having a plurality of openings 365 is formed on the pixel electrodes 191 as shown in FIG. 44 and FIG. 45.

A plurality of light emitting members 370 are formed in the openings 365, and a common electrode 270 is formed on the partition 361 and the light emitting members 370.

As described above, unlike the thin film transistor of the known organic light emitting device including ohmic contacts disposed between an intrinsic semiconductor of a channel and data conductors, the thin film transistor, particularly the driving thin film transistor of the organic light emitting device according to the embodiment of the present invention includes ohmic contacts formed before the formation of an intrinsic semiconductor such that the intrinsic semiconductor of the thin film transistor may not damaged by etching for forming the ohmic contacts.

As described above, according to the embodiments of the present invention ohmic contact, the ohmic contacts are disposed under the intrinsic semiconductor of the channel of the thin film transistor and are formed before the formation of the intrinsic semiconductor. Accordingly, the intrinsic semiconductor of the driving thin film transistor may not be damaged by forming the ohmic contacts such that a fault of the thin film transistor including the channel of polysilicon such as leakage current may be decreased.

Also, the organic light emitting device according to the embodiment of the present invention includes the driving thin film transistor including the channel, which is not damaged and includes polysilicon having high electric field effect mobility and high stability, such that the current flowing in the organic light emitting device is increased to enhance luminance of the organic light emitting device.

Also, the organic light emitting device according to the embodiment of the present invention includes the switching thin film transistor including the channel of amorphous silicon such that a large leakage current of the switching thin film transistor may be decreased to improve on/off characteristic of the switching thin film transistor.

The above-described embodiments include one switching transistor and one driving transistor, however the organic light emitting device according to the above-described embodiments may include at least one additional thin film transistor and a plurality of wiring for driving the additional thin film transistor such that degradation of the organic light emitting diode and the driving transistor may be prevented, and thereby the life time of the organic light emitting device may be increased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device, comprising:
   a substrate;
   first and second spaced apart ohmic contacts formed on the substrate;
   a driving semiconductor including polysilicon formed on the substrate, the driving semiconductor contacting the first and second ohmic contacts and the driving semiconductor disposed on the substrate and the first and second ohmic contacts;
   a driving input electrode electrically connected to the first ohmic contact and disposed on the driving semiconductor and the first ohmic contact;
   a driving output electrode electrically connected to the second ohmic contact and disposed on the driving semiconductor and the second ohmic contact;
   a first gate insulating layer disposed on the driving semiconductor, the driving input electrode, and the driving output electrode; and
   a driving control electrode disposed on the first gate insulating layer, wherein the driving control electrode overlaps the driving semiconductor.

2. The organic light emitting device of claim 1, further comprising:
   third and fourth spaced apart ohmic contacts formed on the substrate;
   a switching semiconductor disposed on the third and fourth ohmic contacts;
   a switching input electrode electrically connected to the third ohmic contact and disposed on the switching semiconductor and the third ohmic contact;
   a switching output electrode electrically connected to the fourth ohmic contact and disposed on the switching semiconductor and the fourth ohmic contact; and
   a control electrode disposed on the first gate insulating layer, wherein the control electrode overlaps the switching semiconductor, and further
   wherein the switching output electrode is electrically connected to the driving control electrode.

3. The organic light emitting device of claim 1, further comprising:
   a switching control electrode disposed on the first gate insulating layer;
   a second gate insulating layer disposed on the switching control electrode;
   a switching semiconductor disposed on the second gate insulating layer and overlapping the switching control electrode;

third and fourth ohmic contacts disposed on the switching semiconductor;
a switching input electrode disposed on the third ohmic contact; and
a switching output electrode disposed on the fourth ohmic contact,
wherein the switching output electrode is electrically connected to the driving control electrode.

4. The organic light emitting device of claim 1, further comprising:
a switching control electrode disposed on the substrate;
a switching semiconductor disposed on the first gate insulating layer and overlapping the switching control electrode;
third and fourth ohmic contacts disposed on the switching semiconductor;
a switching input electrode disposed on the third ohmic contact; and
a switching output electrode disposed on the fourth ohmic contact,
wherein the switching output electrode is electrically connected to the driving control electrode.

5. The organic light emitting device of claim 2, wherein the switching semiconductor includes amorphous silicon or polysilicon.

6. The organic light emitting device of claim 1, wherein the first and second ohmic contacts include polysilicon.

7. The organic light emitting device of claim 1, wherein the first and second ohmic contacts have substantially the same planar shape as the driving input electrode and the driving output electrode.

8. The organic light emitting device of claim 1, further comprising:
a passivation layer disposed on the driving output electrode and the driving input electrode;
a first electrode disposed on the passivation layer and connected to the driving output electrode;
a light emitting member disposed on the first electrode; and
a second electrode disposed on the light emitting member.

9. The organic light emitting device of claim 1, further comprising an insulating layer disposed on the substrate.

* * * * *